United States Patent
Seebauer et al.

(10) Patent No.: US 7,846,822 B2
(45) Date of Patent: Dec. 7, 2010

(54) METHODS FOR CONTROLLING DOPANT CONCENTRATION AND ACTIVATION IN SEMICONDUCTOR STRUCTURES

(75) Inventors: Edmund G. Seebauer, Urbana, IL (US); Richard D. Braatz, Urbana, IL (US); Michael Yoo Lim Jung, Minneapolis, MN (US); Rudiyanto Gunawan, Goleta, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 11/192,339

(22) Filed: Jul. 28, 2005

(65) Prior Publication Data
US 2006/0024928 A1    Feb. 2, 2006

Related U.S. Application Data

(60) Provisional application No. 60/592,902, filed on Jul. 30, 2004.

(51) Int. Cl.
*H01L 21/38* (2006.01)
(52) U.S. Cl. ............... 438/510; 438/514; 438/530; 438/914; 438/920; 257/E21.135
(58) Field of Classification Search .......... 438/514, 438/655, 510–511, 530, 914, 920–922; 257/E21.135, 257/E21.14–E21.141, E21.334–E21.337
See application file for complete search history.

(56) References Cited

U.S. PATENT DOCUMENTS 3,959,025 A * 5/1976 Polinsky ............ 438/301
4,243,865 A   1/1981 Saxena
5,429,708 A * 7/1995 Linford et al. ............ 216/66
5,627,090 A * 5/1997 Marukawa et al. ......... 438/167
5,731,626 A   3/1998 Eaglesham et al.
5,766,695 A * 6/1998 Nguyen et al. ............ 427/553
5,976,956 A  11/1999 Gardner et al.

(Continued)

FOREIGN PATENT DOCUMENTS

JP    06084852 A  *  3/1994

(Continued)

OTHER PUBLICATIONS

Ural, A., Griffin, P.B. and Plummer, J.D. "Experimental Evidence for a Dual Vacany-Interstitial Mechanism of Self-Diffusion in Silicon." Applied Physics Letters. vol. 73, No. 12 (Sep. 21, 1998): pp. 1706-1708.*

(Continued)

*Primary Examiner*—Matthew W Such
(74) *Attorney, Agent, or Firm*—Greenlee Sullivan, P.C.

(57) ABSTRACT

The present invention provides methods for fabricating semiconductor structures and devices, particularly ultra-shallow doped semiconductor structures exhibiting low electrical resistance. Methods of the present invention use modification of the composition of semiconductor surfaces to allow fabrication of a doped semiconductor structure having a selected dopant concentration depth profile, which provides useful junctions and other device components in microelectronic and nanoelectronic devices, such as transistors in high density integrated circuits. Surface modification in the present invention also allows for control of the concentration and depth profile of defects, such as interstitials and vacancies, in undersaturated semiconductor materials.

28 Claims, 16 Drawing Sheets

Implantation prior to surface treatment.

1. Dopant ion implantation.
2. Surface treatment with surface modification agent.
3. Formation of diffusion control groups on surface followed by annealing.

U.S. PATENT DOCUMENTS

| | | | |
|---|---|---|---|
| 6,043,139 A | | 3/2000 | Eaglesham et al. |
| 6,106,898 A * | | 8/2000 | Takamatsu et al. ..... 427/255.21 |
| 6,218,270 B1 * | | 4/2001 | Yasunaga .................... 438/530 |
| 6,537,886 B2 | | 3/2003 | Lee |
| 6,555,451 B1 * | | 4/2003 | Kub et al. ................... 438/542 |
| 6,713,370 B2 * | | 3/2004 | Falster ........................ 438/471 |
| 6,762,136 B1 | | 7/2004 | Bollinger et al. |
| 6,897,118 B1 | | 5/2005 | Poon et al. |
| 6,921,933 B2 | | 7/2005 | Umimoto et al. |
| 6,941,063 B2 | | 9/2005 | Camm et al. |
| 2001/0002709 A1 * | | 6/2001 | Wallace et al. .............. 257/296 |
| 2002/0139975 A1 * | | 10/2002 | Lewis et al. .................... 257/40 |
| 2003/0054641 A1 * | | 3/2003 | Binns et al. ................. 438/689 |
| 2003/0068866 A1 * | | 4/2003 | Chen et al. .................. 438/299 |
| 2006/0024934 A1 * | | 2/2006 | Chan et al. .................. 438/559 |

FOREIGN PATENT DOCUMENTS

| | | |
|---|---|---|
| WO | WO 98/20525 | 5/1998 |
| WO | WO 01/80295 | 10/2001 |
| WO | WO 03018465 A1 * | 3/2003 |
| WO | WO 03/049163 | 6/2003 |
| WO | WO 03/063218 | 7/2003 |

OTHER PUBLICATIONS

Moslehi, M.M. and Saraswat, K.C. "Thermal nitridation of Si and SiO2 for VLSI." IEEE Transactions on Electron Devices. vol. 32, No. 2 (Feb. 1985): pp. 106-123.*

Hersam, M.C., et al. "Atomic-Level Study of the Robustness of the Si(100)-2×1:H Surface Following Exposure to Ambient Conditions." Applied Physics Letters. vol. 78, No. 7 (Feb. 12, 2001): pp. 886-888.*

Seebauer, E.G. "Surface Control of Interstitial Behavior for Improved Ultrashallow Junction Formation." IEEE the Fourth International Workshop on Junction Technology. IWJY '04 (Mar. 15-16, 2004): pp. 81-86.*

Kirichencko, T.A., et al. "Surface Chemistry Effects on Vacancy and Interstitual Annihilation on Si(001)." Physica Status Solidi B. vol. 241, No. 10 (2004): pp. 2303-2312.*

Jung, M.Y.L, et al. "Effect of Near-Surface Band Bending on Dopant Profiles in Ion-Implanted Silicon." Journal of Applied Physics. vol. 95, No. 3 (Feb. 1, 2004): pp. 1134-1140.*

Hlil, E.K., et al. "Photoemission Study of Ammonia Dissociation on Si(100) Below 700K." Physical Review B. vol. 35, No. 11 (Apr. 15, 1987): pp. 5913-5916.*

Franco, N., et al. "Local Structure of NH2 on SI(100)-(2×1) and Its Effect on the Asymmetry of the Si Surface Dimers." Physical Review Letters. vol. 79, No. 4 (Jul. 28, 1997): pp. 673-676.*

Lee, S.-H. and Kang, M.-H. "First-Principles Study of the Dissociative Adsorption of NH3 on the Si(100) Surface." Physical Review B. vol. 58, No. 8 (Aug. 15, 1998): pp. 4903-4908.*

Quirk, M. and Serda, J. Semiconductor Manufacturing Technology. Chapter 17. Prentice Hall, Upper Saddle River, NJ (2001): pp. 475-510.*

Takami, S., et al. "Monolayer Nitridation of Silicon Surfaces by a Dry Chemical Process Using Dimethylhydrazine or Ammonia." Appl. Phys. Lett., vol. 66, No. 12 (Mar. 20, 1995): pp. 1527-1259.*

Hiimi, H. and Lucovsky, G. "Monolayer-Level Controlled Incorporation of Nitrogen at Si-SiO2 Interfaces Using Remote Plasma Processing." J. Vac. Sci. Technol. A, vol. 17, No. 6 (Nov./Dec. 1999): pp. 3185-3196.*

English Translation of JP 06084852 A.*

Quirk, M. and Serda, J. Semiconductor Manufacturing Technology. Chapters 4 & 17. Prentice Hall, Upper Saddle River, NJ (2001): pp. 67-90 and 475-510.*

Lerch, W., et al. "Boron Ultrashallow Junction Formation in Silicon by Low-Energy Implantation and Rapid Thermal Annealing in Inert and Oxidizing Ambient." J. Electrochem. Soc., vol. 146, No. 7 (1999): pp. 2670-2678.*

Rangan, S., et al. "Influence of Hydrogen Plasma Treatment on Boron Implanted Junctions in Silicon." J. Vac. Sci. Technol. B, vol. 21, No. 2 (Mar./Apr. 2003): pp. 781-784.*

Bonasewicz et al. (1982) "Diffusion of Zinc and Oxygen in Nonstoichiometric Zinc Oxide," *Transport in Non-Stoichiometric Compounds. Proceedings of the First International Conference,*, pp. 153-174.

Bond, G.C. (1997) "Preparation and Properties of Vanadia/Titania Monolayer Catalysts," *Appl. Catalysis A* 157:91-103.

Boyes et al. (1985) "Cathodoluminescence of Catalyst Crystallites," *Nature* 313:666-668.

Bracht et al. (1998) "Silicon Self-Diffusion in Isotope Heterostructurs," *Phys. Rev. Lett.* 81:393-396.

Bracht et al. (2000) "Large Disparity Between Gallium and Antimony Self-Diffusion in Gallium Antimonide," *Nature* 408:69-72.

Campbell, S.A. (2001) *The Science and Engineering of Microelectronic Fabrication*, $2^{nd}$ ed., New York, Oxford, pp. 16-21,98-122.

Chadi et al. (1987) "Stabilities of Single-Layer and Bilayer Steps on Si(001) Surfaces," *Phys. Rev. Lett.* 59:1691-1694.

Cowern et al. (1997) "Low Energy Implantation and Transient Enhanced Diffusion: Physical Mechanisms and Technology Implications," *Mat. Res. Soc. Symp. Proc.* 469:265-276.

Cowern et al. (1990) "Impurity Diffusion Via an Intermediate Species: The B-Si System," *Phys. Rev. Lett.* 65:2434-2437.

Current et al. (1993) "Defect Engineering of $P^+$-Junctions by Multiple-Species Ion Implantation," *Nucl. Instrum. Meth. Phys. Res. B* 74:175-180.

Demond et al. (1983) "Study of Si Self-Diffusion by Nuclear Techniques," *Phys. Lett.* 93A:503-506.

Dev et al. (2005) "Band Bending at the Si(100)-$Si_3N_4$ Interface Studied by Photoreflectance Spectroscopy," *Surf. Sci.* 583:80-87.

Dev et al. (2003) "Mechanism for Coupling Between Properties of Interfaces and Bulk Semiconductors," *Phys. Rev. B* 68:195311:1-6.

Dev et al. (2004) "Band Bending at the Si(111)-SiO2 Interface Induced by Low-Energy Ion Bombardment," *Surf. Sci.* 550:185-191.

Diamant et al. (2003) "Core-Shell Nanoporous Electrode for Dye Sensitized Solar Cells," *J. Phys. Chem. B* 107:1977-1981.

Downey et al. (1999) "Effects of 'Fast' Rapid Thermal Anneals on Sub-keV Boron and $BF_2$ Ion Implants," *J. Electronic Mater.* 28:1340-1343.

Drucker et al. (1991) "Biased Secondary Electron Imaging of Monatomic Surface Steps on Vicinal Si(100) in a UHV STEM," *Ultramicroscopy* 35:323-328.

Fahey et al. (1989) "Point Defects and Dopant Diffusion in Silicon," *Rev. Mod. Phys.* 61:289-384.

Frank et al. (1984) *Diffusion in Crystalline Solids*, Murch et al. Eds., Academic Press, New York, pp. 63-142.

Fukami et al. (2002) "Effects of Sputtering Atmosphere Oxygen Pressure on Photocatalytic Phenomena in Anatase Films," *Jap. J. Appl. Phys., Part 2 Lett.* 41:L794-L796.

Fukata et al. (2001) "Vacancy Formation Energy of Silicon Determined by a New Quenching Method," *Jpn. J. Appl. Phys.* 40:L854-L856.

Gao et al. (1996) "Thermal Stability and the Role of Oxygen Vacancy Defects in Strong Metal Support Interaction—Pt on Nb-Doped $TiO_2(100)$," *Surf. Sci.* 365:638-648.

Gossmann et al. (1995) Behavior of Intrinsic Si Point Defects During Annealing in Vacuum, *Appl. Phys. Lett.* 75:1558-1560.

Gratzel, M. (2001) "Photoelectrochemical Cells," *Nature* 414:338-344.

Gunawan et al. (2003) "Parameter Sensitivity Analysis Applied To Modeling Transient Enhanced Diffusion and Activation of Boron in Silicon," *J. Electrochem. Soc.* 150(12):G758-G765.

Haber et al. (1997) "Vanadium Pentoxide I: Structure and Properties," *Appl. Catal. A* 157:3-22.

Hakala et al. (2000) "First-Principles Calculations of Interstitial Boron in Silicon," *Phys. Rev. B* 61:8155-8161.

Hirvonen et al. (1979) "Self-Diffusion in Silicon as Probed by the $(\rho,\gamma)$ Resonance Broadening Method," *Appl. Phys. Lett.* 35:703-705.

Jain et al. (2002) "Transient Enhanced Diffusion of Boron in Si," *J. Appl. Phys.* 91:8919-8941.

Jung et al. (2004) "Effect of Near-Surface Band Bending on Dopant Profiles in Ion-Implanted Silicon," *J. Appl. Phys* 95:1134-1140.

Jung et al. (2004) "Pair Diffusion and Kick-Out: Quantifying Relative Contributions to Diffusion of Boron in Silicon," *AIChE J.* 50:3248-3256.

Jung et al. (2003) "Ramp-Rate on Transient Enhanced Diffusion and Dopant Activation," *J. Electrochem. Soc.* 150(12):G838-G842.

Kirichenko et al. (2004) "Interactions of Neutral Vacancies and Interstitials with the Si(001) Surface," *Phys. Rev. B* 70:045321:1-7.

Masters et al. (1966) "Silicon Self-Diffusion," *Appl. Phys. Lett.* 8(11):280-281.

McCarty et al. (2001) "Vacancies in Solids and the Stability of Surface Morphology," *Nature* 412:622-625.

Nakabayashi et al. (2003) "Self-Diffusion in Intrinsic and Extrinsic Silicon Using Isotopically Pure $^{30}$Silicon/Natural Silicon Heterostructures," *Jpn. J. Appl. Phys.* 42:3304-3310.

Okino et al. (1997) "Self0Interstitials in Silicon," *Jpn. J. Appl. Phys.* 36:6591-6594.

Roberts et al. (1990) "Total Energy Calculations of Dimer Reconstructions on the Silicon (001) Surface," *Surf. Sci.* 236:112-121.

Robin et al. (1973) "Application of a Nondestructive Single-Spectrum Proton Activation Technique to Study Oxygen Diffusion in Zinc Oxide," *J. Appl. Phys.* 44:3770-3777.

Rodriguez et al. (2001) "Chemistry of $NO_2$ on Oxide Surfaces: Formation of $NO_3$ on $TiO_2(110)$ and $NO_2$-O Vacancy Interactions," *J. Am. Chem. Soc.* 123:9597-9605.

Rodriguez et al. (2002) "Activation of Gold on Titania: Adsorption and Reaction of $SO_2$ on $Au/TiO_2(110)$," *J. Am. Chem. Soc.* 124:5242-5250.

Shao et al. (2003) "Boron Diffusion in Silicon: The Anomalies and Control by Point Defect Engineering," *Mat. Sci. Eng.* R42:65-114.

Sharp et al. (2002) "Self- and Dopant Diffusion in Extrinsic Boron Doped Isotopically Controlled Silicon Multilayer Structures," *Mat. Res. Soc. Symp. Proc.* 719:433-438.

Shewmon, P. (1989) *Diffusion in Solids*, Warrendale, PA, Metals and Materials Soc., pp. 116-122.

Silvestry et al. (2002) "Dopant and Self-Diffusion in Extrinsic n-Type Silicon Isotopically Controlled Hetterostructures," *Mat. Res. Soc. Symp. Proc.* 719:427-432.

Takeda et al. (2001) "Photocatalytic $TiO_2$ Thins Film Deposited onto Glass by DC Magnetron Sputtering," *Thin Solid Films* 392:338-344.

Van Vechten (1988) Activation Enthalpy of Recombination Vacancy Migration in Si, *Phys. Rev. B* 38:9913-9919.

Voronkov et al. (2000) "The Sensitivity of Thermal Donor Generation in Silicon to Self-Interstitial Sinks," *J. Electrochem. Soc.* 147:3899-3906.

Wachs et al. (1997) "Structure and Reactivity of Surface Vanadium Oxide Species on Oxide Supports," *Appl. Catalysis A* 157:67-90.

Wantanabe et al. (2004) "Direct-Bandgap Properties and Evidence for Ultraviolet Lasing of Hexagonal Boron Nitride Single Crystal," *Nature Mat.* 3:404-409.

Wuensch et al. (1994) "Lattice Diffusion, Grain Boundary Diffusion and Defect Structure of ZnO," *J. Phys. Chem. Solids* 55:975-984.

A. Ural, P. B. Griffin, J. D. Plummer, Phys. Rev. Lett. 83(17), 3454 (1999).

D. Fan and R. J. Jaccodine, "Role of recoil implanted oxygen in determining boron diffusion in silicon," J. Appl. Phys., 67 (1990) 6135.

D. W. Robinson and J. W. Rogers, Jr., "A surface chemistry investigation of the low pressure nitridation of Si(100) using 1,1-dimethylhydrazine," Appl. Surface Sci., 152 (1999) 85.

F. W. Smith and G. Ghidini, J. Electrochem. Soc., 129 (1982) 1300.

G. Dufour, F. Rochet, H. Roulet and F. Sirotti, "Contrasted behavior of Si(001) and Si(111) surfaces with respect to NH/sub 3/ adsorption and thermal nitridation: a N 1s and Si 2p core level study with synchrotron radiation," Surface Sci., 304 (1994) 33.

H. Kato, K. Sawabe and Y. Matsumoto, "Adsorbed states and thermal reactions of N2O on Si(100) below room temperature: desorption induced by dissociation," Surface Sci., 351 (1996) 43.

K. Dev and E. G. Seebauer, "Measurement of Fermi Pinning at Si-SiO2 Interfaces: Implications for TED Spike Anneals," Rapid Thermal and Other Short-Time Processing Technologies III (ECS vol. PV-2002-11, 2002) 357-362.

K. P. Loh, C. R. Kingsley, J. S. Foord and R. B. Jackman, "The interaction of azomethane with Si(100)," Surface Sci., 341 (1995) 92.

M. Riehl-Chudoba, L. Surney and P. Soukiassian, "Nitric oxide adsorption on the Si(111) 7×7 surface: Effect of potassium overlayers," Surface Sci., 243 (1994) 313.

M. Y. L. Jung, R. Gunawan, R. D. Braatz and E. G. Seebauer, "A Simplified Picture for Transient Enhanced Diffusion of Boron in Silicon," J. Electrochem. Soc., 151 (2004) G1-G7.

Paloura, Nauka, Lagowski, and Gatos, Appl. Phys. Lett., vol. 45, No. 2, pp. 97-99, Jul. 14, 1986.

R. Gunawan, M. Y. L. Jung, E. G. Seebauer and R. D. Braatz, "Maximum A Posteriori Estimation of Transient Enhanced Diffusion Energetics," AIChE J., 49 (2003) 2114-2123.

S. M. Cherif, J. P. Lacharme and C. A. Sebenne, "Surface properties of Si(111)7×7 upon NH3 adsorption and vacuum annealing," Surface Sci., 351 (1991) 113.

T. Jana, S. Mukhopadhyay and S. Ray, "Low temperature silicon oxide and nitride for surface passivation of silicon solar cells," Solar Energy Materials & Solar Cells, 71 (2002) 197.

T. L. Bush, D. O. Hayward and T. S. Jones, "The sodium promoted nitridation of Si(100)-2×1 using N2 molecular beams," Surface Sci., 313 (1994) 179.

Y. Bu and M. C. Lin, "Surface chemistry of N2H4 on Si(100)-2×1," Surface Sci., 311 (1994) 385.

U.S. Appl. No. 12/407,144, Seebauer.

Baumvol (Dec. 1999) "Atomic Transport During Growth of Ultrathin Dielectrics on Silicon," *Surf. Sci. Rep.* 36(1-8):1-166.

Du et al. (May 1990) "Activation Energy Distribution in Temperature-Programmed Desorption: Modeling and Application to the Soot-Oxygen System," *Energy and Fuels* 4(3):296-302.

Jung et al. (2003) "Parameter Sensitivity Analysis Applied to Modeling Transient Enhanced Diffusion and Activation of Boron in Silicon," *J. Electrochem. Soc.* 150:G758-G765.

Kwok, Charlotte (2007) PhD Thesis, University of Illinois.

Niimi et al. (Nov./Dec. 1999) "Monolayer-Level Controlled Incorporation of Nitrogen at $Si-SiO_2$ Interfaces Using Remote Plasma Processing," *J. Vac. Sci. Technol.* 17(6):3185-3196.

Seebauer, E.G. (1994) "Quantitative Extraction of Continuous Distributions of Energy States and Pre-Exponential Factors from Thermal Desorption Spectra," *Surf. Sci.* 316:391-405.

Vaidyanathan et al. (2006) "Influence of Surface Adsorption in Improving Ultrashallow Junction Formation," *Appl. Phys. Lett.* 89:152114.

Vaidyanathan, Ramakrishnan (2007) PhD Thesis, University of Illinois.

Xu et al. (2007) "Built-In Electric Field Enhancement/Retardation on Intermixing," *Appl. Phys. Lett.* 91:181111.

Yeong et al. (2007) "Defect Engineering by Surface Chemical State in Boron-Doped Pre-amorphized Silicon," *J. Appl. Phys.* 91:102112.

Advani et al. (1980) "Oxygen Vacancy Diffusion in $SnO_2$ Thin Films," *Int. J. Electronics* 48(5):403-411.

Allen et al. (Jan./Feb. 1996) "Surface Diffusion of In on Si(111): Evidence for Surface Ionization Effects," *J. Vac. Sci. Technol.* A14(1):22-29.

Aspnes, D.E. (Jun. 1973) "Third-Derivative Modulation Spectroscopy with Low-Field Electroreflectance," *Surf. Sci.* 37:418-442.

Aspnes et al. (Jul. 26, 1971) "High-Resolution Interband-Energy Measurements from Electroreflectance Spectra," *Phys. Rev. Lett.* 27(4):188-190.

Baumberger et al. (Dec. 15, 2000) "Step-Induced One-Dimensional Surface State on Cu(332)," *Phys. Rev. B.* 62(23):15431-15434.

Bernasik et al. (1994) "Electrical Surface Versus Bulk Properties of Fe-Doped $TiO_2$ Single Crystals," *Solid State Ionics* 72:12-18.

Bracht et al. (Nov. 2, 2000) "Large Disparity Between Gallium and Antimony Self-Diffusion in Gallium Antimonide," *Nature* 408:69-72.

Cardona et al. (Feb. 15, 1967) "Electroreflectance at Semiconductor-Electrolyte Interface," *Phys. Rev.* 154(3):696-720.

Carlson et al. (Nov. 1, 1993) "Adsorption/Desorption Kinetics of $H_2O$ on GaAs(100) Measured by Photoreflectance," *J. Chem. Phys.* 99(9):7190-7197.

Castellanos et al. (Mar. 1, 1993) "Surface Magnetism: A Monte Carlo Study of Surface Critical Behavior," *Phys. Rev. B* 47(9):5037-5040.

Cowern et al. (Dec. 15, 1990) "Transient Diffusion of Ion-Implanted B in SI: Does, Time and Matrix Dependence of Atomic and Electrical Profiles," *J. Appl. Phys.* 68(12):6191-6196.

Dalton et al. (2004) "Structure and Mobility on Amorphous Silicon Surfaces," *Surf. Sci.* 550:140-148.

David et al. (1989) "Coherent Surface Fluorescence Versus Thermally Activated Energy Transfer to the Bulk in the Anthracene Crystal: Model Calculations and Some Experimental Results," *Chem. Phys.* 132:31-39.

Dev et al. (2003) "Mechanism for Coupling Between Properties of Interfaces and Bulk Semiconductors," *Phys. Rev. B* 68:195311.

Dev et al. (2003) "Surface Vacancy Charging on Semiconductors at Nonzero Temperatures," *Phys. Rev. B.* 67:035312(1-4).

Dev et al. (2003) "Vacancy Charging on Si(111)-(7×7) Investigated by Density Functional Theory," *Surf. Sci.* 538:L495-L499.

Ditchfield et al. (Aug. 10, 1998) "Nonthermal Effects of Photon Illumination on Surface Diffusion," *Phys. Rev. Lett.* 81(6):1259-1262.

Ditchflield et al. (May 15, 2000) "Semiconductor Surface Diffusion: Nonthermal Effects of Photon Illumination," *Phys. Rev. B* 61(20):13710-13720.

Ditchfield et al. (Feb. 8, 1999) "Direct Measurement of Ion-Influences Surface Diffusion," *Phys. Rev. Lett.* 82(6):1185-1188.

Ditchfield et al. (2001) "Semiconductor Surface Diffusion: Effects of Low-Energy Ion Bombardment," *Phys. Rev. B.* 63:125317.

Fair et al. (Apr. 15, 1998) "Photonic Effects in the Deactivation of Ion Implanted Arsenic," *J. Appl. Phys.* 83(8):4081-4090.

Gunawan et al. (2002) "Identification of Kinetic Parameters in a Multidimensional Crystallization Process," *Int. J. Modern. Phys. B* 16(1-2):367-374.

Gunawan et al. (2004) "Optimal Control of Rapid Thermal Annealing in a Semiconductor Process," *J. Process Control* 14:423-430.

Gyulai et al. (Jan. 1994) "Athermal Effects in Ion Implanted Layers," *Rad. Effects Defects Solids* 127:397-404.

Hakala et al. (Mar. 15, 2000) "First-Principles Calculations of Interstitial Boron in Silicon," *Phys. Rev. B* 61(12):8155-8161.

Hallen et al. (Jul. 7, 1999) "Migration Energy for the Silicon Self-Interstitial," *J. Appl. Phys.* 86(1):214-216.

Heinrich et al. (May 31, 1976) "Observation of Two-Dimensional Phases Associated with Defect States on the Surface of $TiO_2$," *Phys. Rev. Lett.* 36(22):1335-1339.

Hermann et al. (1999) "Electronic Properties, Structure and Adsorption at Vanadium Oxide: Density Functional Studies," *Faraday Discuss* 114:53-66.

Hoffmann et al. (Jan. 1995) "Environmental Applications of Semiconductor Photocatalysis," *Chem. Rev.* 95(1):69-96.

Hori et al. (1986) "Rapid Oxidation of No to $NO_2$ at ppm Concentration Level in a Heterogeneous Photocatalytic Reaction on Metal Oxide Powders," *Chem. Lett.* 15:(11):1845-1848.

Hoshino et al. (1985) "Diffusion and Point Defects in $TiO_{2-x}$," *J. Phys. Chem. Solids* 46(12):1397-1411.

Ibusuki et al. (Feb. 22, 1994) "Removal of Low Concentration Nitrogen Oxides Through Photoassisted Heterogeneous Catalysis," *J. Mol. Catal.* 88(1):93-102.

Ishikawa et al. (Dec. 1997) "Diffusion of Phosphorus and Boron into Silicon at Low Temperatures by Heating with Light Irradiation," *Jpn. J. Appl. Phys.* 36:7433-7436.

Jung et al. (Nov. 3, 2003) "Ramp-Rate Effects on Transient Enhanced Diffusion and Dopant Activation: A Simple Explanation," *J. Electrochem.* 150(12):G838-G842.

Jung et al. (2002) "Measurement of Nonthermal Illumination-Enhanced Diffusion in Silicon," In; *Rapid Thermal and Other Short-Time Processing Technologies III*, Electrochemical Society.

Jung et al. (2002) "Measurement of Nonthermal Illumination-Enhanced Diffusion in Silicon," *Proceedings of the 10th IEEE International Conference on Advanced Thermal Processing of Semiconductors* 133-136.

Kanata et al. (Nov. 15, 1990) "Photoreflectance Characterization of Surface Fermi Level in as-Grown GaAs(100)," *J. Appl. Phys.* 68(10):5309-5313.

Kapoor et al. (Feb. 1997) "Measurement of Solid State Diffusion Coefficients by a Temperature-Programmed Method," *J. Mater. Res.* 12(2):467-473.

Kase et al. (Sep. 1995) "Photoassisted Chemisorption of No on ZnO," *J. Phys. Chem.* 99(36):13307-13309.

Kim et al. (2000) "Annealing of $CH_3I$ Films on $TiO_2$(110) Studied with TPD and UV-Induced Esorption," *Surf. Sci.* 445:177-185.

Kisliuk (1957) "The Sticking Probabilities of Gases Chemisorbed on the Surfaces of Solids," *J. Phys. Chem. Solids* 3:95-101.

Kisliuk (1958) "The Sticking Probabilities of Gases Chemisorbed on the Surfaces of Solids-II," *J. Phys. Chem. Solids* 5:78-84.

Kondo et al. (Aug. 15, 1976) "Symmetry Analysis and Uniaxial-Stress Effect on the Low Field Electroreflectance of Si from 3.0 to 4.0 eV," *Phys. Rev. B* 14(4):1577-1592.

Kwok et al. (2005) "A Method for Quantifying Annihilation Rates of Bulk Point Defects at Surfaces," *J. Appl. Phys.* 98:013524.

Lambrecht et al. (1983) "Electronic Structure of Bulk and Surface Vanadyl Oxygen Vacancies in the Layer Compound $V_2O_5$," *Surf. Sci.* 126:558-564.

Lautenschlager et al. (Sep. 15, 1987) "Temperature Dependence of the Dielectric Function and Interband Critical Points in Silicon," *Phys. Rev. B* 36(9):4821-4830.

Lee et al. (1998) "First-Principles Study of the Self-Interstitial Diffusion Mechanism in Silicon," *J. Phys Condens. Matter* 10:995-1002.

Li et al. (2002) "Gas Sensing Properties of p-Type Semiconducting Cr-Doped $TiO_2$ Thin Films," *Sens. Actuators B* 83:160-163.

Lojek et al. (2001) "Athermal Annealing of Ion-Implanted Silicon," *9th Int. Conference on Advnaced Thermal Processing of Semiconductors-RTP'* 2001 :125-131.

Ma et al. (Web Release Mar. 15, 2003) "Robust Identification and Control of Batch Processes," *Comp. Chem. Eng.* 27:1175-1184.

Mariz et al. (Jan. 1, 1987) "Influence of the Interaction Anisotropy on the Appearance of Surface Magnetism," *Europhysics Lett.* 3(1):27-31.

Mata et al. (Oct. 1, 1982) "Thin Ferromagnetic Films on Nonmagnetic Metallic Substrates: A Model Calculation," *Phys. Rev. B* 26(7):3841-3845.

McEllistren et al. (Apr. 19, 1993) "Electrostatic Sample-Tip Interactions in the Scanning Tunneling Microscope," *Phys. Rev. Lett.* 70(16): 2471-2474.

Mendicino et al. (1993) "Detailed In-Situ Monitoring of Film Growth: Application to $TiSi_2$ CVD," *J. Cryst. Growth* 134:377-385.

Millot et al. (1988) "Oxygen Self-Diffusion in Non-Stoichiometric Rutile $TiO_{2-x}$ at High Temperature," *Solid State Ionics* 28-30:1344-1348.

Miotto et al. (2003) "Adsorption of $NH_3$ on Ge(001)," *Phys. Rev. B* 68:115436.

Noel et al. (1998) "Optical Effects During Rapid Thermal Diffusion," *J. Electron. Mat.* 27(12):1315-1322.

Noel et al. (May 18, 1998) "Impact of Ultraviolet Light During Rapid Thermal Diffusion," *Appl. Phys. Lett.* 72(20):2583-2585.

Pichat et al. (Feb. 1982) "Photocatalytic Oxidation of Various Compounds over $TiO_2$ and Other Semiconductor Oxides: Mechanistic Considerations," *Can. J. Chem. Eng.* 60(1):27-32.

Poniewierski et al. (Mar. 1996) "Anchoring of Nematic Liquid Crystals at a Solid Substrate," *Phys. Rev. E* 53(3):2436-2443.

Rafferty, C.S. (2000) "Front-End Process Simulation," *Solid-State Electronics* 44:863-868.

Ramirex et al. (1990) "Oxygen Reactivity in Vanadium Pantoxide. Electronic Structure and Infrared Spectroscopy Studies," *J. Phys. Chem.* 94(26):8960-8965.

Rusi et al. (1997) "Defect Sites on $TiO_2$(110). Detection by $O_2$ Photodesorption," *Langmuir* 13(16):4311-4316.

Salvador, P. (1992) "Dynamic Electrolyte Electroreflectance Measurements for the in Situ Detection of Flatband Potential Shifts," *Electrochimica Acta* 37(5):957-971.

Schultz et al. (Nov. 1, 1992) "Surface Diffusion of Sb on Ge(111) Monitored Quantitatively with Optical Second Harmonic Microscopy," *J. Chem. Phys.* 97(9):6958.

Schultz et al. (Mar. 1993) "Microscopy of Adsorbates by Surface Second-Harmonic Generation," *J. Opt. Soc. Am. B* 10(3):546-550.

Shen et al. (1988) Photoreflectance of GaAs and $Ga_{0.82}Al_{0.18}As$ at Elevated Temperature, *Appl. Phys. Lett* 53:1080.

Shultz et al. (1995) "Comparative Second Harmonic Generation and X-Ray Photoelectron Spectroscopy Studies of the UV Creation and $O_2$ Healing of $Ti^{3+}$ Defects on (110) Rutile $TiO_2$ Surfaces," *Surf. Sci.* 339:114-124.

Szczepankiewics et al. (Web Release Oct. 4, 2000) "Infrared Spectra of Photoinduced Species on Hydroxylated Titania Surfaces," *J. Phys. Chem. B* 104:9842-9850.

Tomlins et al. (Jan. 1, 2000) "Zinc Self-Diffusion, Electrical Properties, and Defect Structure of Undoped, Single Crystal Zinc Oxide," *J. Appl. Phys.* 87(1):117-123.

Ural et al. (May 1, 1999) "Fractional Contributions of Microscopic Diffusion Mechanisms for Common Dopants and Self-Diffusion in Silicon," *J. Appl. Phys.* 85(9):6440-6446.

Ural et al. (1999) "Nonequilibrium Experiments on Self-Diffusion in Silicon at Low Temperatures Using Isotopically Enriched Structures," *Physica B* 273-274:512-515.

Vaidyanathan et al. (2006) "Measurement of Defect-Mediated Diffusion: The Case of Silicon Self Diffusion," *AIChE J.* 52(1):366-370.

Van Vechten, J.A. (Feb. 15, 1988) "Divacancy Binding Enthalpy and Contribution of Divacancies to Self-Diffusion in Si," *Phys. Rev. B* 33(4):2674-2689.

Venkatu et al. (1970) "Diffusion of Titanium in Single Crystal Rutile," *Mater. Sci. Eng.* 5:258-262.

Vitomirov et al. (Aug. 15, 1989) "Reversible Temperature-Dependent Fermi-Level Movement for Metal-GaAs(110) Interfaces," *Phys. Rev. B* 40(5):3483-3486.

Wang et al. (Apr. 15, 1993) Dimer Vacancies and Dimer-Vacancy Complexes on the Si(100) Surface, *Phys. Rev. B* 47(16):10497-10508.

Wieser et al. (1984) "Influence of Flash-Lamp Annealing on the Diffusion Behavior of Ion Implanted Boron Profiles," *Phys. Stat. Sol. A* 81:247-252.

Wuensch et al. (1994) "Lattice Diffusion, Grain Boundary Diffusion and Defect Structure of ZnO," *J. Phys. Chem. Solids* 55(10):975-984.

Yeung et al. (2003) "Vacancy Charging on Si(100)-(2×1): Consequences for Surface Diffusion and STM Imaging," *Phys. Rev. B* 67:035311(1-7).

Yokoyama et al. (Oct. 15, 1997) "Dimer Buckling Induced by Single-Dimer Vacancies on the Si(100) Surface Near $T_c$," *Phys. Rev. B* 56(16):10483-10487.

Zhanpeisov et al. (1996) "Quantum Chemical SINDO1 Study of Vanadium Pentoxide," *Catal. Lett.* 39:111-118.

* cited by examiner

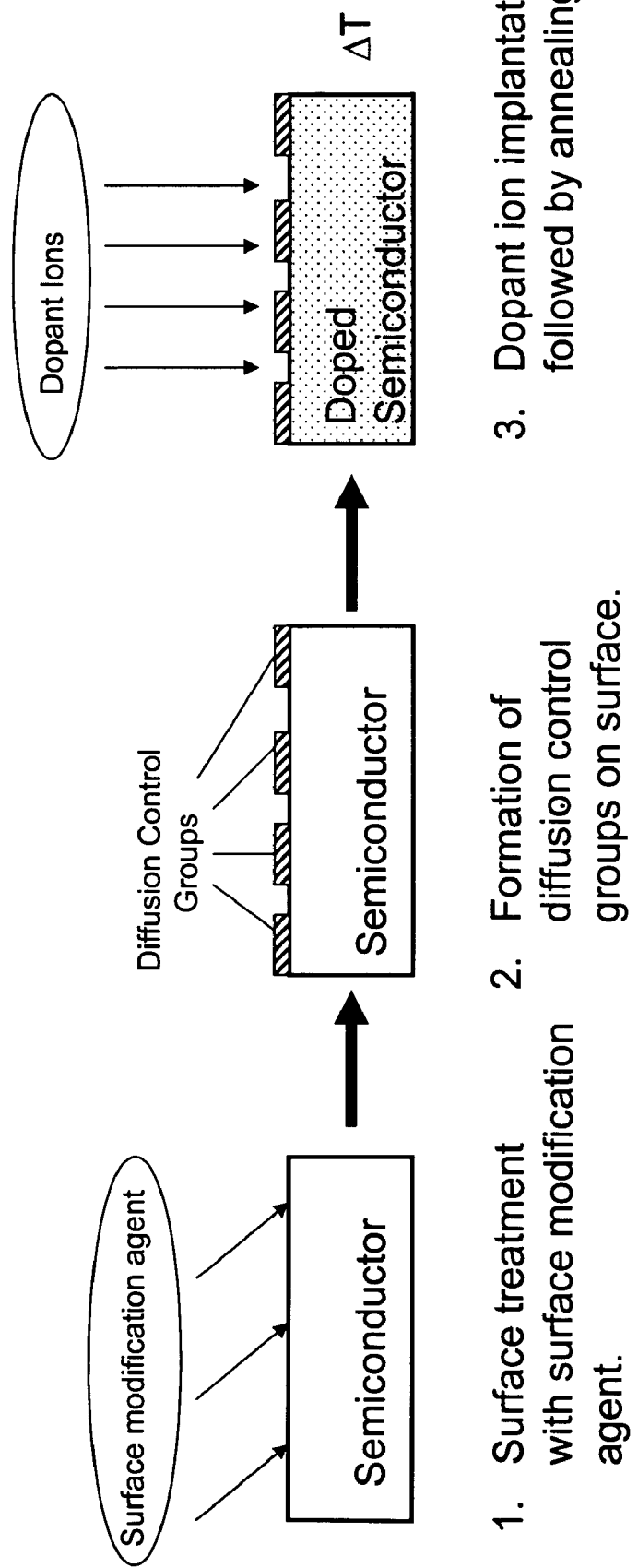

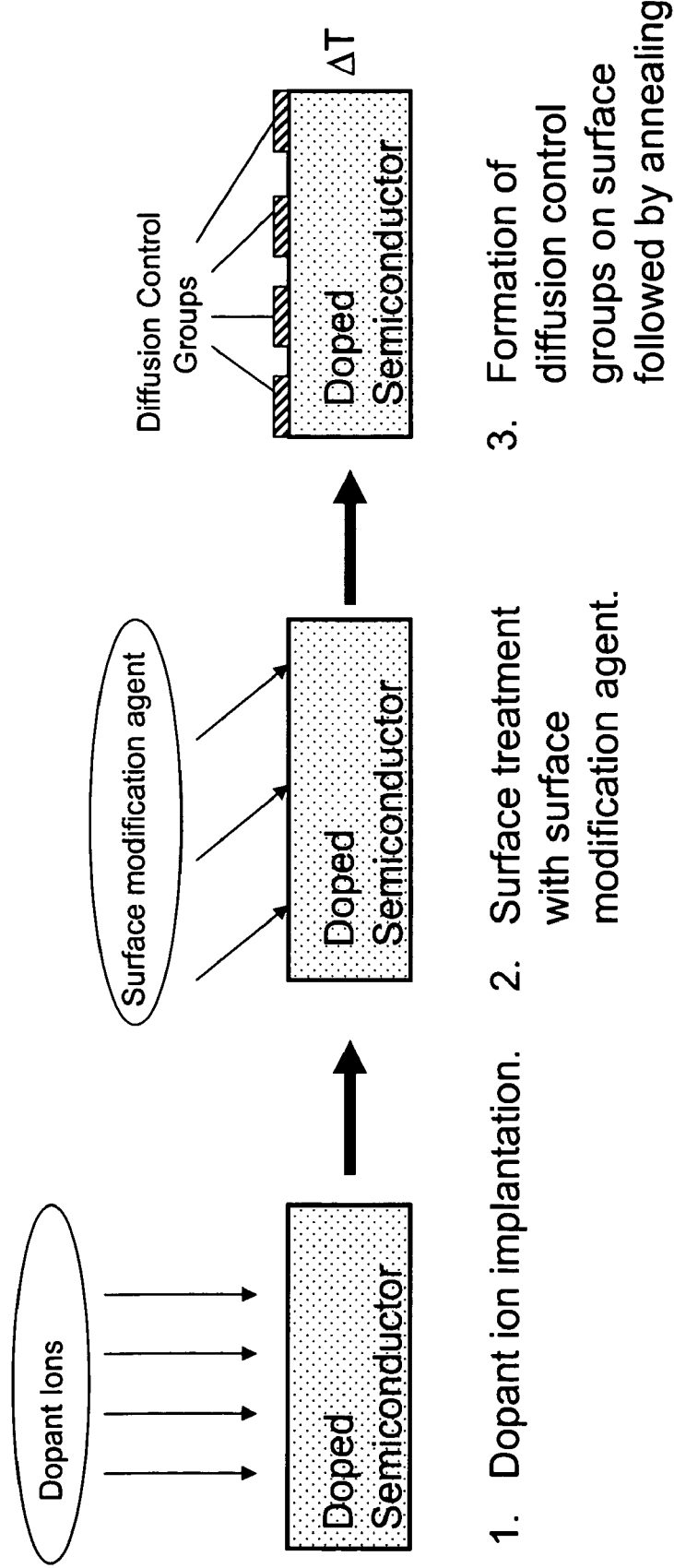
Fig. 2B: Implantation prior to surface treatment.

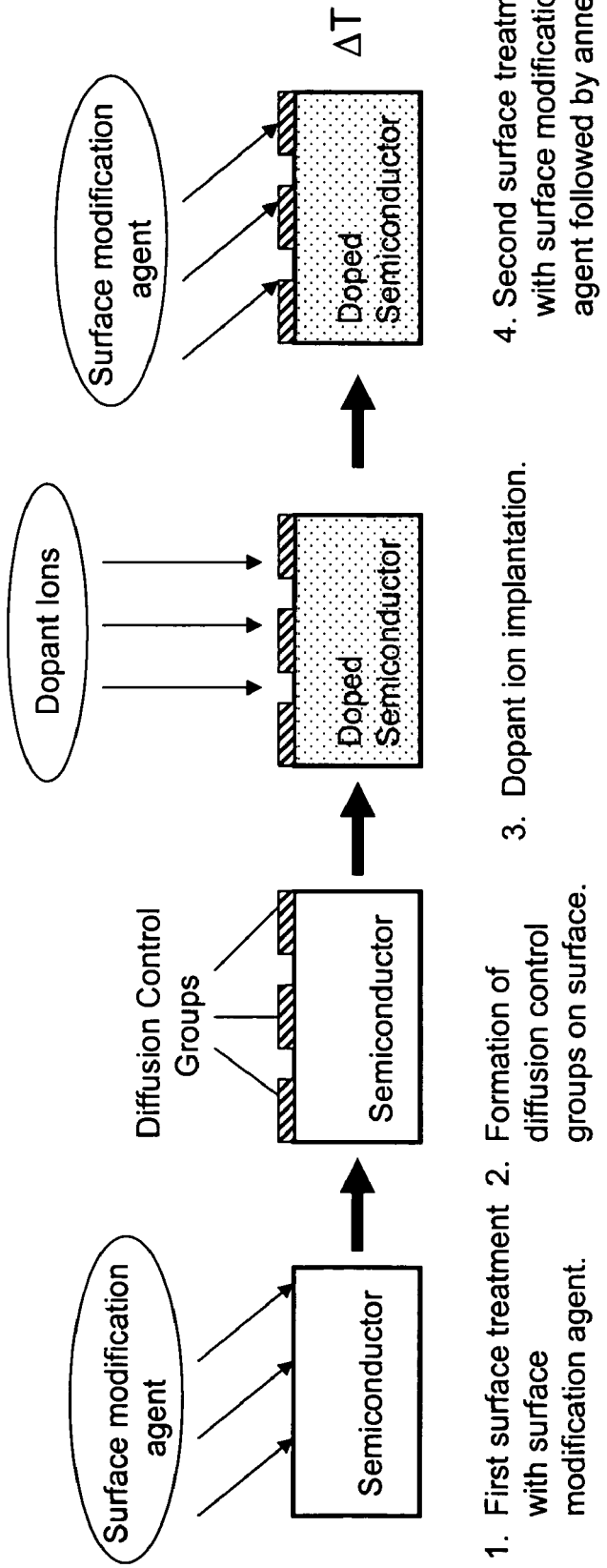

METHODS FOR CONTROLLING DOPANT CONCENTRATION AND ACTIVATION IN SEMICONDUCTOR STRUCTURES

CROSS-REFERENCE TO RELATED APPLICATIONS

This application claims priority under 35 U.S.C. 119(e) to U.S. provisional Patent Application 60/592,902 filed Jul. 30, 2004, which is hereby incorporated by reference in its entirety to the extent not inconsistent with the disclosure herein.

STATEMENT REGARDING FEDERALLY SPONSORED RESEARCH OR DEVELOPMENT

This invention was made, at least in part, with United States governmental support awarded by National Science Foundation Grants CTS 98-06329 and 02-03237. The United States Government has certain rights in this invention.

BACKGROUND OF INVENTION

The continuing trend toward smaller, higher speed microelectronic devices requires integrated circuit designs characterized by smaller feature sizes and closer spacing between electrical components. These requirements have generated an immediate demand for methods for fabricating extremely shallow and spatially well defined dopant-containing semiconductor layers that exhibit very low electrical resistance in microelectronic devices. For example, current complementary metal oxide semiconductor (CMOS) transistors (schematically illustrated in FIG. 1) in integrated microelectronic circuits require source-drain junction depths ($X_j$ in FIG. 1) of less than 100 nanometers, and it is predicted that by 2010 a further decrease of source-drain junction depths ($X_j$ in FIG. 1) by a factor of ten will be required to continue scaling of microelectronic device performance according to Moore's Law: the doubling of the density of transistors on a chip about every 18 months. The International Technology Roadmap for Semiconductors currently acknowledges, however, that there are no known manufacturing solutions to satisfy these rapidly evolving device requirements. Accordingly, fabrication of extremely shallow dopant-containing semiconductor layers having low electrical resistance, such as dopant-containing layers comprising P-N junctions in CMOS transistors, is a fundamental barrier to continued advances in the performance of many microelectronic devices.

The fabrication of integrated electronic circuits having reduced feature sizes requires methods for introducing conductivity-altering dopant materials into semiconductor substrates that provide control of electrically active dopant concentrations in both lateral and vertical dimensions. Semiconductor dopants, such as boron, arsenic or phosphorous atoms, may be introduced into semiconductor layers of microelectronic devices by thermal diffusion methods, or by ion implantation followed by annealing. For the fabrication of high density integrated electrical circuits, however, ion implantation techniques, particularly those employing low implantation energies, are generally preferred over thermal diffusion methods because ion implantation provides reproducible and precise control over the spatial distribution of dopants implanted into the bulk phase of a semiconductor substrate. Furthermore, thermal diffusion methods are susceptible to problems associated with lateral diffusion of dopants, poor control of dopant concentrations and a propensity to generate dislocations, which can significantly impede satisfaction of the feature size and spacing requirements of electrical components in dense integrated electrical circuits. As a result of these considerations, source-drain junctions in most high density integrated circuits are currently fabricated using ion implantation methods.

In conventional ion implantation methods, a selected semiconductor dopant material is ionized in an ion source and accelerated to form an ion beam having a selected distribution of energies. The ion beam is directed to an exposed surface of a semiconductor substrate, and the accelerated ions penetrate the exposed surface and enter the bulk phase. Ions lose energy via collisions with atoms in the semiconductor substrate, thereby eventually coming to rest and becoming embedded in the substrate. The concentration of dopant implanted in the substrate may be controlled by selection of the flux of the ion beam together with the total implantation time, and the dopant depth profile in the semiconductor substrate can be controlled to some extent by selection of the acceleration energy imparted to the ion beam. After implantation, the dopant-containing layer is annealed, often to temperatures over 1000 degrees Celsius, to electrically activate the dopant atoms by positioning them into substitutional sites in the lattice of the semiconductor substrate. In addition, annealing after implantation promotes repositioning of atoms comprising the semiconductor into lattice sites, thereby repairing disruptions of the semiconductor lattice caused by dopant implantation.

The depth of dopant material in a semiconductor substrate is largely determined by the implantation energies employed during ion implantation. Shallower dopant containing layers can be prepared using lower ion implantation energies. Subsequent annealing of the dopant-containing layer, however, inevitably causes dopant atoms to diffuse, thereby increasing the physical dimensions of the dopant-containing layer. Current annealing technologies have run into a limit in their ability to simultaneously increase dopant activation and decrease dopant diffusion, especially for the key dopant boron. This problem has been worsened by the need to continually reduce processing temperatures to avoid damaging structures already in place during device fabrication.

Dopant diffusion behavior is largely determined by a complex interplay between lone interstitials of both dopant and semiconductors, and by interstitial clusters containing various mixtures of dopant and semiconductors that render the lone interstitials immobile. Vacancies also play a role to some extent. During implantation, numerous lone interstitials are created that diffuse quickly. Some interstitials annihilate vacancies, but because the extra atoms introduced by implantation cause the interstitials to outnumber vacancies, the remaining interstitials accrete into clusters. Subsequent annealing dissociates these clusters releasing both semiconductor and dopant interstitials. Some dopant atoms enter lattice sites and become electrically activated by participating in "kick in" substitution reactions that displace atoms of the host semiconductor. However, semiconductor interstitials may reverse this process by participating in efficient "kick out" substitution reactions that convert immobilized, electrically active dopant atoms in substitutional atomic sites into highly mobile, electrically inactive dopant atoms. Such enhanced diffusion attributed to processes promoted by interstitial point defects generated during implantation or thermal processing comprise the primary portion of what are commonly referred to as transient enhanced diffusion (TED) mechanisms. These complex diffusion mechanisms constitute a fundamental limit on the control of physical dimensions of dopant-containing layers prepared by ion implantation methods and currently impede reproducible fabrication of ultra-shallow (<200 nm) dopant-containing layers.

The undesirable effects of TED are exacerbated by the higher concentrations of active dopant required for improved microelectronic device performance. Such high concentrations are well above the thermodynamic solubility limit and, thus the corresponding structures are thermodynamically unstable. Ion implantation at the high ion fluxes required to achieve such dopant concentrations creates a large number of defects and interstitials in the bulk phase of the semiconductor substrate which promotes fast TED of the dopants during annealing. These TED mechanisms involving interstitials ultimately results in significant junction deepening. In addition, implantation at high ion fluxes may generate electrically charged defect sites residing at the exposed surface of the semiconductor layer in sufficient numbers that they couple to the motion of charge defects in the underlying bulk. As bulk defects mediate diffusion of dopants in the bulk phase, such surface electrical charges can induce a corresponding change in the dopant concentration depth profile, generally deepening it. Accordingly, while ion implantation provides some degree of control of electrically active dopant concentrations and concentration depth profiles in semiconductor substrates, additional means of controlling dopant diffusion during annealing is greatly needed to reduce structure sizes and to provide improved precision of dopant depth profiles (in both vertical and lateral directions) necessary for the development of the next generation of higher performing integrated electronic devices.

A number of approaches for reducing TED in implanted semiconductor substrates have been developed over the last decade to enable fabrication of very shallow dopant-containing semiconductor layers, such as P-N junctions in CMOS transistors. Substantial research has been directed at developing methods of engineering various kinds of defects in the bulk phase of semiconductor substrates which provide an effective sink for semiconductor interstitials. These methods include the use of foreign atoms, such as carbon or halogens, dislocation loops, and co-implantation with high energy ions. Such defect engineering methods, however, have generally demonstrated limited utility. Other approaches to reducing TED in implanted semiconductor substrates include laser annealing and deposition methods for growing ultra thin dopant-containing junctions. While these methods may effectively limit the occurrence of TED, implementation of these methods is expected to require solutions to a large number of problems associated with integration of these methods into existing and well developed semiconductor processing techniques. Such integration issues remain a significant barrier to adoption of these approaches for fabricating ultra-shallow dopant-containing semiconductor layers.

International Patent Application No. PCT/US01/12377 (International Publication No. WO 01/80295) describes a method for forming a junction involving implantation of nitrogen into the bulk phase of a semiconductor wafer. The application alleges that the implanted nitrogen retards diffusion of dopant material during annealing and, thereby provides a method of fabricating ultra shallow junctions in semiconductor substrates. The methods provided are limited, however, to techniques wherein the nitrogen provided to the semiconductor substrate is implanted to depths in the bulk phase of the semiconductor roughly equivalent to the implanted dopant, and the application indicates that implantation of nitrogen into the bulk unavoidably introduces damage to the semiconductor substrate. Further, although the application asserts that TED can be reduced, it is unclear if the disclosed methods also provide a means of increasing electrical activation of implanted dopant materials.

U.S. Pat. Nos. 5,731,626 and 6,043,139 describe processes for controlling dopant diffusion in thin semiconductor films generated by chemical vapor deposition. The disclosed methods involve incorporation of a diffusion-suppressing amount of an electrically inactive species, such as carbon, nitrogen, fluorine and oxygen, into the bulk phase of a growing semiconductor layer prepared by chemical vapor deposition methods. The presence of electrically inactive species in the bulk phase of the thin semiconductor layer is reported to suppress diffusion of subsequently implanted dopants by providing a sink for interstitials during annealing. Although the application indicates that TED in the thin semiconductor layer can be reduced, it is unclear if the disclosed methods also provide a means of increasing the electrical activation of implanted dopant materials.

Downey et al. disclose a method of introducing dopant into silicon substrates wherein the surface of the silicon substrate is exposed to 30-100 ppm of $O_2$ during an annealing step preceding B or $BF_2$ implantation [D. F. Downey, S. W. Falk, A. F. Bertuch and S. D. Marcus, "Effects of 'fast' rapid thermal anneals on sub-keV boron and $BF_2$ ion implants," *J. Electronic Mater.* 28 (1999) 1340]. The authors report that higher sheet resistance and retained dose were observed for dopant-containing semiconducted layers prepared by annealing in controlled environments of low $O_2$ in $N_2$. This behavior has been interpreted as indicating a decreased hole mobility for shallow implants due to the formation of a thin silicon oxide surface layer. As device dimensions scale downward, however, the procedures disclosed in Downey et al. provide insufficient flexibility for optimally adjusting the loss rates of silicon interstitials and/or dopants. For example, too little $O_2$ results in disappearance of the oxide surface layer leading to loss of too much dopant, and too much $O_2$ injects unwanted silicon interstitials into the bulk yielding oxygen-enhanced diffusion.

It will be appreciated from the foregoing that there is currently a need in the art for methods for fabricating dopant-containing semiconductor layers having well defined and selected physical dimensions. Methods of controlling the concentrations and depth profiles of electrically active dopants in semiconductor substrates are needed. Particularly, methods of making ultra shallow junctions, such as P-N junctions, in microelectronic devices are needed that are compatible with existing and well developed semiconductor device fabrication techniques. Further, methods of controlling diffusion of dopants by reducing TED in implanted semiconductor substrates are needed that do not result in significant dopant losses.

SUMMARY OF THE INVENTION

The present invention provides methods for fabricating semiconductor structures and devices, particularly ultra-shallow doped semiconductor structures exhibiting low electrical resistance. Methods of the present invention allow fabrication of a doped semiconductor structure having a selected dopant concentration depth profile, which provides useful junctions and other device components in microelectronic and nanoelectronic devices, such as transistors in high density integrated circuits. It is an object of the present invention to provide methods and devices for electrically activating semiconductor dopants that exhibit low dopant losses and reduced dopant diffusion with respect to conventional thermal processing methods. It is another object of the present invention to provide methods for precisely controlling dopant diffusion in lateral and vertical dimensions during thermal processing. It is further an object of the present invention to provide improved ion implantation and annealing methods that are compatible with existing semiconductor processing and device fabrication techniques and, thus, are easily integrated into well developed semiconductor technologies.

In one aspect, the present invention provides a method for making a doped semiconductor wherein the rate and/or extent of dopant diffusion during annealing is selectively adjustable. In an embodiment, a semiconductor having an exposed surface is provided and the exposed surface is treated with a surface modifying agent. Interaction between the surface modifying agent and the semiconductor forms diffusion control groups on the exposed surface. Preferably for methods providing selected semiconductor dopant concentrations and concentration depth profiles, a selected surface abundance of the diffusion control groups are generated on the exposed surface of the semiconductor. Dopant is implanted into the semiconductor, and the semiconductor having implanted dopant is annealed, thereby generating a semiconductor having electrically activated dopant. In this embodiment of the present invention, selection of the surface abundance of diffusion control groups controls the rate and/or extent of diffusion of dopant during annealing by adjusting the rates of important diffusion-related processes that couple the surface and bulk phases of a semiconductor structure. Selection of the surface abundance of diffusion control groups in methods of the present invention also controls the rate of dopant loss to the surface during annealing and may be used to provide efficient dopant activation with low dopant loss.

The ability to concurrently control the rate and/or extent of diffusion of dopant and the rate of dopant loss during annealing provides methods wherein the concentrations and concentration depth profiles of electrically activated dopants in a semiconductor structure may be accurately selected and/or optimized for a particular device or device component configuration. In one method of the present invention, the concentrations and concentration depth profiles of electrically activated dopants in a semiconductor structure are controlled by appropriate selection of the composition and surface abundance of diffusion control groups on the exposed semiconductor surface. In this aspect of the present invention, coupling of chemical and physical properties of the surface and bulk phases of a semiconductor structure may be employed to simultaneously reduce dopant diffusion and increase dopant electrical activation relative to conventional thermal processing techniques.

In one embodiment of this aspect of the present invention, the composition and selected surface abundance of diffusion control groups formed on the semiconductor surface establishes the loss rate of bulk interstitial atoms, particularly bulk phase semiconductor interstitial atoms, to the exposed, treated surface. As the concentration of bulk phase interstitials substantially affects the extent and rate of dopant diffusion during annealing, for example by establishing the rate of "kick out" substitution reactions that convert immobile, electrically activated dopants into mobile, electrically inactivated dopants, selective adjustment of the loss rate of bulk interstitial atoms to the exposed, treated surface may be used in the present invention to control the rate of diffusion of the dopants during annealing. Therefore, selective adjustment of the loss rate of bulk interstitial atoms to the exposed, treated surface may be used to control the physical dimensions of a doped semiconductor structure and/or the dopant concentration depth profile of a doped semiconductor structure fabricated using the present methods. For example, the present invention provides methods wherein diffusion control groups establish a selected high loss rate of bulk interstitial semiconductor atoms to the treated surface due to a high surface loss probability (e.g. >0.001), thereby establishing a selected lower dopant diffusion rate useful for providing doped semiconductor structures having reduced depths. Alternatively, the present invention provides methods wherein diffusion control groups establish a selected low loss rate of bulk interstitial semiconductor atoms to the treated surface due to a low surface loss probability (e.g. <0.001), thereby establishing a higher dopant diffusion rate in the bulk that is useful for providing doped semiconductor structures having enhanced depths. Importantly, the loss rate of bulk interstitial semiconductor atoms provided by the methods of the present invention may be continuously varied (or "tuned") over a wide, useful range, thus providing the ability to precisely control the physical dimensions of doped semiconductor structures fabricated and/or average depth or function form of the dopant concentration depth profile achieved during annealing.

In the present invention, surface loss probabilities for bulk interstitial semiconductor atoms may be selectively varied by formation of diffusion control groups which eliminate free, dangling bonds on the exposed semiconductor surface. This embodiment of the present invention, therefore, provides a means for selectively reducing the surface loss rate of bulk interstitial semiconductor atoms via reaction with free, dangling bonds present on the exposed surface. For example, atomically clean semiconductor surfaces, such as single crystalline silicon surfaces, are known to have a large number of free, dangling bonds, which react efficiently with bulk phase semiconductor interstitial atoms resulting in significant reactive loss of semiconductor interstitial atoms. The reaction between bulk phase semiconductor interstitial atoms and free, dangling bonds at the surface, therefore, provides an effective sink for interstitial semiconductor atoms in the methods of the present invention. In one embodiment, formation of diffusion control groups by interaction of a surface modifying agent and the exposed surface of a semiconductor eliminates at least a portion of dangling bonds, such as between about 20% to about 100%, on the exposed surface, thereby directly reducing the loss probabilities for bulk interstitials to the treated semiconductor surface Alternatively, surface loss probabilities for bulk interstitial semiconductor atoms may be selectively varied by formation of diffusion control groups which react directly with bulk interstitial semiconductor atoms and/or which form additional free, dangling bonds on the exposed semiconductor surface. In this aspect of the present invention, formation of diffusion control groups on the treated semiconductor surface provides an enhanced surface sink for bulk interstitial semiconductor atoms, thereby attenuating the extent of dopant diffusion in the bulk phase relative to bulk phase diffusion in systems without surface modification.

In one embodiment, the surface abundance of diffusion control groups formed on the treated semiconductor surface establishes a surface loss probability for bulk interstitial semiconductor atoms selected over the range of about $1.0 \times 10^{-5}$ to about 1, preferably for some applications $10 \times 10^{-4}$ to about $1.0 \times 10^{-2}$. Due to transport mechanisms in a bulk phase semiconductor, surface loss of semiconductor interstitials is significantly more effective than corresponding processes resulting in dopant loss. For example, interstitial silicon atoms are expected to diffuse toward the exposed surface about 100 times faster than a dopant, such as boron, at typical high doping levels near 1% for the range of interstitial loss probabilities of about 1 to about $1 \times 10^{-4}$, because dopant interstitials are impeded by exchange with the bulk lattice atoms in a way that interstitial semiconductor atoms are not. This preferential nature of the interstitial loss mechanisms employed in the present invention is beneficial because it maintains electrically active dopant fixed in the lattice by inhibiting "kick-out" substitution reactions thereby inhibiting undesirable dopant diffusion while at the same time providing a relatively low loss rate of dopant to the exposed, treated surface.

In another embodiment of this aspect of the present invention, the composition and selected surface abundance of diffusion control groups formed on the semiconductor surface establishes the electric charge of the exposed surface, which in turn establishes a corresponding electric field in the space charge region of the underlying semiconductor. Selective adjustment of the surface electric charge and, therefore, the electric field in the present invention may also be used for controlling the rate of diffusion of the dopants during annealing because electrically charged defect sites residing at the exposed surface of a semiconductor couple, via the electric field, to the motion of charge defects in the underlying bulk. As these charged bulk defects mediate diffusion of dopants in the bulk phase, a reduction in surface electrical charges and corresponding electric field is used in the present invention to control the rate of diffusion of dopants during thermal processing. In one embodiment, formation of diffusion control groups, such as surface adsorbed N or O, by interaction of the surface modifying agent and the exposed semiconductor surface lowers the degree of electrical charge built up at the surface, thereby making the surface less reflecting with respect to dopant interstitials. This aspect of the present invention provides a method of reducing the diffusion rate of dopants and is useful for fabricating ultra-shallow doped semiconductor structures. Importantly, the degree of electrical charge at the exposed surface may be continuously varied (or "tuned") in the present invention over a wide, useful range, providing a correspondingly tunable electric fields (e.g. between $1\times10^{-5}$ V/cm and $5\times10^{-6}$ V/cm corresponding to the average electric field of the space charge region proximate to the surface) by selection of an appropriate composition and surface abundance of diffusion control groups residing at the semiconductor surface. This aspect of the present invention is beneficial because it provides the ability to precisely control the physical dimensions of doped semiconductor structures fabricated and/or the dopant concentration depth profile achieved during annealing.

In another embodiment of this aspect of the present invention, the composition and selected surface abundance of diffusion control groups formed on the semiconductor surface establishes both the electric charge of the exposed surface and the intrinsic loss probability of bulk interstitial atoms, particularly bulk phase semiconductor interstitial atoms, to the exposed, treated surface. The present invention includes use of a diffusion control group that affects both surface electrical change and surface interstitial loss rate. Alternatively, the present invention includes embodiments wherein a plurality of surface modification agents are used to generate a plurality of different diffusion control groups having different effects on the physical, electrical and/or chemical properties of the exposed semiconductor surface. An advantage of using a plurality of different diffusion control groups to control the surface properties of doped semiconductor materials is that surface electrical charge and interstitial loss rate to the surface may be independently selected, thereby providing enhanced control of dopant diffusion behavior and, thus, enabling more accurate and precise control of dopant concentration depth profiles.

The methods of the present invention can also be used to control the distribution of other kinds of bulk defects with respect to the surface. For example, vacancies are charged, and thus are subject to control by methods of the present invention providing a selected surface electric charge and corresponding electric field. Selection of the surface loss rate and/or surface loss probability of interstitial can also affect the abundance and distribution of vacancies. More generally, any defect capable of migrating to the surface of a semiconductor may be controlled by the methods of the present invention. This aspect of the present invention is important with respect to fabrication of optical devices, where the present methods provide a means of indirectly engineering immobile extended defects like dislocations, which decay by emitting interstitials. In this application of the present invention, the removal of interstitials by the surface increases the net decay rate. This phenomenon can be exploited in the fabrication of various optical semiconductor devices, where the defects are sometimes optically active and can affect device performance.

Optionally, the methods of the present invention may further comprise the step of heating the semiconductor before, during and/or after treatment with a surface modifying agent. Heating a semiconductor to a temperature selected from the range of about 400 degrees Celsius to about 900 degrees Celsius is beneficial for promoting the formation of some diffusion control groups on semiconductor surfaces, such as diffusion control groups which require dissociation of the surface modifying agent prior to or during formation. Alternatively, the present invention includes use of surface modifying agents comprising plasmas, such as an $O_2$ or $N_2$ plasma, which provide for dissociation of the surface modifying agent prior to formation of diffusion control groups on the exposed semiconductor surface.

Methods of the present invention provide control of dopant concentration profiles in three dimensions. Control of dopant concentration profiles with respect to vertical dimensions (i.e. dopant depth concentration profiles) is very important for fabricating shallow doped semiconductor structures, such as shallow junctions and shallow source and drain extensions. Control of dopant concentration profiles with respect to the lateral dimensions is also important for fabrication of source and drain extensions in transistors. The shape of these regions strongly affects the current flow in the channel region under the gate. The present methods using surface treatment aid in keeping these regions from spreading by diffusion.

Surface modifying agents useful in the methods of the present invention are capable of interacting with semiconductor surfaces in a manner generating diffusion control groups on an exposed semiconductor surface, preferably a selected surface abundance of diffusion control groups on an exposed semiconductor surface. Diffusion control groups of the present invention can selectively increase or decrease the loss rate of semiconductor interstitial with the semiconductor surface. The surface abundance of diffusion control groups may be controlled in the present invention by selection of the composition of one or more surface modifying agents exposed to the semiconductor surface, the exposure time, the temperature of the semiconductor surface during exposure, concentrations or partial pressures of one or more surface modifying agents exposed to the semiconductor surface, the total pressure of the system during exposure or any combination of these parameters. In one embodiment of the present invention, the surface abundance of diffusion control groups is selected from the range of about $5\times10^{13}$ molecules $cm^{-2}$ to about $2\times10^{15}$ molecules $cm^{-2}$, more preferably for some applications $4\times10^{14}$ molecules $cm^{-2}$ to about $9\times10^{14}$ molecules $cm^{-2}$. Alternatively, the surface abundance of diffusion control groups is selected from the range of about 0.1 to about 3 monolayers, and more preferably for some applications 0.7 monolayers to about 1.3 monolayers.

Interaction of surface modifying agents and an exposed semiconductor surface may generate diffusion control groups comprising chemically adsorbed species, physically adsorbed species or a combination of chemically adsorbed species and physically adsorbed species on a semiconductor surface. Alternatively, surface modifying agents may chemically react with an exposed semiconductor surface, thereby generating functional groups covalently bound to the semiconductor surface. Surface modifying agents useful in the methods include nitrogen-containing compounds, carbon-containing compounds, oxygen-containing compounds, and plasmas. Surface modifying agents useful for some aspects of the present invention comprise a gas or a mixture of gases.

Diffusion control groups of the present invention affect the chemical properties, electrical properties and/or physical properties of semiconductor surfaces, such as the surface composition, chemical reactivity, the number and/or surface abundance of free, dangling bonds, surface electrical charge or any combination of these. Diffusion control groups preferred for some applications are highly stable on a semiconductor surface, for example groups that are bound to the surface by covalent bonds, such as single and double silicon and nitrogen bonds and nitride bonds, and/or molecules or groups of molecules that are bound to the surface by strong electrostatic forces provided by intermolecular forces, hydrogen bonds, dipole-dipole interactions, van der Waals forces or any combination of these. Diffusion control groups may be present on semiconductor surfaces in less than monolayer amounts or may be present in monolayer or multilayer amounts. Use of diffusion control groups that strongly bind to a semiconductor surface is beneficial because these groups are stable at elevated temperatures, such as temperatures ranging from about 400 degrees Celsius to about 1000 degrees Celsius, and therefore, do not appreciable degrade, sublimate or evaporate at conventional semiconductor annealing temperatures and protocols. A significant advantage of the present methods is that they are compatible with standard thermal processing methods for semiconductor device fabrication.

Steps of methods of the present invention may be executed in any order providing good control of dopant diffusion and dopant electrical activation processes. The present invention includes embodiments wherein the step of treating the exposed surface of the semiconductor with the surface modifying agent is performed prior to the step of implanting the semiconductor with dopants. Treatment of the exposed surface with surface modifying agents prior to implantation is beneficial because it permits thermal processing during or after treatment at fairly high temperatures (up to about 900 degrees Celsius). In some instances, elevated temperature during or after treatment promotes dissociation of surface modification agents which ensures formation of high quality diffusion control groups. The diffusion control groups formed in this embodiment, however, may be disrupted and/or damaged during the subsequent implantation step. Alternatively, the present invention includes embodiments wherein the step of implanting the semiconductor with dopants is performed prior to the step of treating the exposed surface of a semiconductor with the surface modifying agent. In this embodiment, however, gas treatment after implantation may be carried out at relatively low temperatures (<about 400 degrees Celsius to about 800 degrees Celsius) to prevent the dopant implant profile from spreading. The present invention also includes methods wherein the semiconductor surface is exposed to surface modifying groups both before and after implantation with dopant. In this embodiment, the semiconductor surface may be exposed to the same surface modification agent before and after implantation. Alternatively, the semiconductor surface may be exposed to different surface modification agents or mixtures of different surface modification agents before and after implantation. The present invention includes methods wherein the semiconductor surface is exposed to surface modification agent(s) during implantation processing steps.

In another aspect the present invention provides methods of electrically activating semiconductor dopants which exhibit reduced dopant loss, as compare to conventional dopant activation methods. To become electrically activated in a semiconductor, dopants must move into substitutional sites in the semiconductor lattice where they are activated electronically and rendered immobile, as discussed above, however, interstitial semiconductor atoms participate in efficient "kick out" substitution reactions which convert electrically active, immobile dopants into electrically inactive, mobile interstitial dopants. The methods of the present invention may be used to suppress the rate of such "kick out" substitution reactions by establishing a surface sink for interstitials. Particularly, the present methods provide a sink that eliminates bulk semiconductor interstitials more efficiently than dopant interstitials due to lattice substitution transport mechanisms available to bulk semiconductor interstitials that are not available to dopant interstitials. Furthermore, methods of the present invention provide a surface sink for interstitials having a loss rate that may be controlled by controlling the composition and surface abundance of diffusion controlling groups. The ability to precisely and continuously control (or "tune") the surface loss rate for interstitials is important because it allows selection of a loss rate large enough to effectively inhibit undesirable "kick out" substitution reactions but not too large such that loss of dopants to the surface becomes significant. This trade off approach for determining the loss rate of interstitials to the semiconductor surface provides an enhancement in dopant activation levels and a reduction in dopant loss relative to conventional thermal processing techniques.

The methods of the present invention provide an improvement to conventional ion implantation and annealing technologies. In addition, the methods of the present invention are compatible with the processing conditions employed in the fabrication of many semiconductor devices, including compatibility with a range of annealing protocols such as spike annealing, arclamp flash annealing and submelt laser annealing. As such, the methods of the present invention are broadly applicable to the manufacture and design of most semiconductor containing devices and device components. The ability to control and/or minimize semiconductor diffusion provided by the present methods makes them especially well suited for fabricating ultra shallow junctions, such as source-drain junctions and/or P-N junctions. The present invention is capable of making doped semiconductor layers having a depth of less than or equal to about 200 nanometers, more preferably for some application less than or equal to about 20 nanometers, which provide junctions in transistors having low electrical resistance. Use of junctions having small depths is useful for providing transistors capable of good device performance such as very fast switching. The methods of the present invention may be used to fabricate a range of semiconductor-based devices, including but not limited to, n-MOS devices, P-MOS devices, CMOS devices, bipolar junction transistors, field effect transistors, BiCMOS devices, thin film transistors, heterojunction devices, diodes, integrated circuits and photovoltaics.

The methods of the present invention may be used to control dopant diffusion and activation in a very wide range of semiconductor materials including pre-strained semiconductor materials. In addition, the present methods may be use to control diffusion in non-semiconductor materials, such as insulators, and, thus are not limited to applications involving the fabrication of semiconductor devices and device components. Other applications of the present methods include fabrication of composite materials, materials having dopants that provide useful structural properties and chemical properties, microelectromechanical systems, nanoelectromechanical systems, and optoelectronic systems.

In another aspect, the present invention provides a method for controlling dopant diffusion during annealing comprising the steps of: (1) providing a semiconductor having an exposed surface; (2) treating the exposed surface of the semiconductor with a surface modifying agent, wherein interaction between the surface modifying agent and the semiconductor forms diffusion control groups on the exposed surface; (3) generating a selected surface abundance of the diffusion control groups on the exposed surface; (4) implanting the semiconductor with a dopant thereby generating a semiconductor having implanted dopant; and (5) annealing the semiconductor having implanted dopant. In this method, selection of the surface abundance of the diffusion control groups establishes the rate of interstitial loss to the exposed surface, establishes the electric charge of the exposed surface which controls reflection of interstials back or both, thereby controlling the rate of diffusion of the dopants during annealing.

In another aspect, the present invention provides a method for controlling the concentration of defects in a semiconductor, the method comprising the steps of: (1) providing the semiconductor, such as a undersaturated semiconductor, having an exposed surface; (2) treating the exposed surface of the semiconductor with a surface modifying agent, wherein interaction between the surface modifying agent and the semiconductor forms chemiadsorbed or physiadsorbed molecules on the exposed surface; and (2) generating a selected surface abundance of the chemiadsorbed or physiadsorbed molecules on the exposed surface; thereby controlling the concentration of defects in the semiconductor.

BRIEF DESCRIPTION OF THE DRAWINGS

FIGS. 2A, 2B and 2C provide schematic representations of several processes of the present invention for making a doped semiconductor structure that provides control over the dopant diffusion.

DETAILED DESCRIPTION OF THE INVENTION

Figure 1:
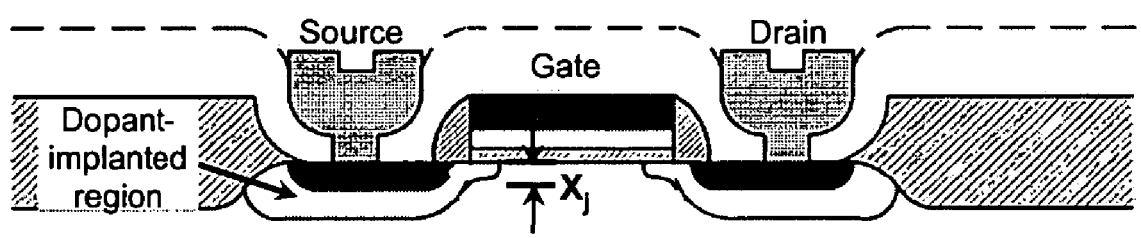
FIG. 1 schematically illustrates an CMOS transistor showing the junction depth ($X_j$).

Referring to the drawings, like numerals indicate like elements and the same number appearing in more than one drawing refers to the same element. In addition, hereinafter, the following definitions apply:

"Semiconductor" refers to any material that is an insulator at a very low temperature, but which has a appreciable electrical conductivity at a temperature of about 300 Kelvin. In the present description, use of the term semiconductor is intended to be consistent with use of this term in the art of electronic device fabrication and processing. Semiconductors useful in the present invention may comprise elemental semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductors having p-type doping materials and n-type doping materials. The term semiconductor includes composite materials comprising a mixture of semiconductors.

"Dopant" refers to ions, atoms, compounds, or any aggregates or combinations of these that are introduced into a material, usually in small quantities, to affect the material's chemical, electrical or physical properties. As used herein dopants include, atoms, compounds, or any aggregates or combinations of these that are introduced in a semiconductor to affect the semiconductor's electrical characteristics, such as the semiconductor's electrical conductivity and resistance. Dopants useful in the present invention include p-type dopants such as boron, n-type dopants such as phosphorous, antimony and arsenic, and combinations of n-type dopants and p-type dopants.

"Interstitial" refers to an atom, ion and/or molecule that does not reside in the lattice sites or substituted lattice sites of a material, such as a single crystalline or polycrystalline semiconductor. Interstitial also may refer to a cluster of atoms, ions, molecules or any combination of these that does not reside in the lattice sites or substituted lattice sites of a material. Interstitials may comprise semiconductor atoms or clusters of semiconductor atoms which are not located in the lattice sites of a semiconductor and/or dopant atoms or clusters of dopant atoms that are not located in the substituted lattice sites of a semiconductor. The present methods of controlling dopant electrical activation and/or dopant diffusion provide a selected loss rate of interstitials, such as interstitial semiconductor atoms, to an exposed, treated surface of a semiconductor.

"Ultra-shallow" refers to the spatial dimensions, such as thickness, of a doped semiconductor structure, layer or region, such as a junction. In one embodiment of the present invention, ultra-shallow refers to a doped semiconductor structure having a thickness less than or equal to about 200 nanometers, preferably for some applications less than or equal to about 20 nanometers.

"Surface abundance" refers to the abundance of a material or combination of materials on a surface, such as an exposed surface of a semiconductor. Surface abundance may be characterized in terms of number of atoms, ions or molecules located on a surface per square centimeter. Alternatively, surface abundance may be characterized in terms of the number of monolayers or multilayers or the fraction of monolayers or multilayers on a surface. In the present invention, diffusion control groups may be present on semiconductor surfaces in less than monolayer amounts or may be present in monolayer or multilayer amounts. In an embodiment of the present invention, the surface abundance of diffusion control groups is selected over the range of $5\times10^{13}$ molecules $cm^{-2}$ to about $2\times10^{15}$ molecules $cm^{-2}$, more preferably for some applications $4\times10^{14}$ molecules $cm^{-2}$ to about $9\times10^{14}$ molecules $cm^{-2}$ In another embodiment, the surface abundance of diffusion control groups is selected from the range of about 0.1 to about 3 monolayers, preferably for some applications 0.7 monolayers to about 1.3 monolayers.

"Surface loss probability" for interstitials, such as interstitial semiconductor atoms, refers to the probability that an interstitial atom is lost at a surface upon interacting with or encountering the surface. In the present invention, the surface loss probability of interstitial semiconductor atoms may be controlled by selection of the surface abundance of diffusion control groups on a semiconductor surface. In one embodiment of the present invention, the surface abundance of diffusion control groups formed on a treated semiconductor surface establishes a surface loss probability for bulk interstitial semiconductor atoms selected over the range of about $1.0\times10^{-5}$ to about 1, preferably for some applications $1.0\times10^{-4}$ to about $1.0\times10^{-2}$.

"Dopant concentration depth profile" is a characteristic related to the spatial distribution of a dopant or mixture of dopants in a semiconductor structure, such as a semiconductor layer. Dopant concentration depth profile may refer to a one dimensional distribution of the concentrations of a dopant or mixture of dopants as a function of distance from a surface. Dopant concentration depth profile may also refer to a two dimensional or three dimensional distribution of the concentrations of a dopant or mixture of dopants corresponding to a two dimensional area or three dimensional volume as a function of distance from a defined patch on the surface. The present invention provides methods of making doped semiconductor structures wherein the functional form, average depth and other characteristics of a dopant concentration depth profile may be accurately selected.

"Diffusion control group" refer to materials residing at a semiconductor surface that affect the chemical properties, electrical properties and/or physical properties of semiconductor surfaces, such as the surface composition, chemical reactivity, the number and/or surface abundance of free, dangling bonds, surface electrical charge or any combination of these. Diffusion control groups preferred for some applications are highly stable on a semiconductor surface, for example groups that are bound to the surface by covalent bonds, such as single and double silicon and nitrogen bonds and nitride bonds, and/or groups that are bound to the surface by electrostatic forces such as intermolecular forces, hydrogen bonds, dipole-dipole interactions, van der Waals forces or any combination of these. Diffusion control groups may be present on semiconductor surfaces in less than monolayer amounts or may be present in monolayer or multilayer amounts. Diffusion control groups may be chemically adsorbed species such as chemiadsorbed N, physically adsorbed species such as physiadsorbed N, functional groups such as nitride groups, functional groups having silicon-nitrogen single bonds or functional groups having silicon-nitrogen double bonds, or any combination of these. The present invention provides methods wherein diffusion control groups are provided on exposed semiconductor surfaces to control bulk diffusion and electrical activation of dopants during annealing of implanted semiconductor materials. The present invention also provides methods wherein diffusion control groups are provided on exposed semiconductor surfaces to control bulk diffusion, emission and annihilation of defects, such as interstitials and vacancies, in supersaturated and undersaturated semiconductor materials In the present invention, diffusion control groups may be generated in sub-monolayer amounts on a semiconductor surface or in a layer comprising a monolayer or multilayers. The present invention provides methods of wherein the surface abundance of diffusion control groups may be selectively and continuously adjusted or "tuned" over a wide, useful range.

"Surface modification agent" refers to compounds, atoms, ions or any aggregates or mixtures of these that are capable of interacting with semiconductor surfaces in a manner generating diffusion control groups on an exposed semiconductor surface, preferably a selected surface abundance of diffusion control groups on an exposed semiconductor surface. Surface modifying agents useful in the methods include, but are not limited to, nitrogen-containing compounds such as $N_2$, $NH_3$, $N_2H_4$, $HN_3$, $NO$, $N_2O$, $NO_2$, $N_2O_5$, $CH_3N_2CH_3$, $(CH_3)_2NNH_2$, an amine, HCN, and a nitrile, carbon-containing compounds such as a hydrocarbon, CO, an alcohol, an organic acid, an aldehyde; and an ester, oxygen-containing compounds such as $O_2$, $H_2O$, $H_2O_2$, and $O_3$, and plasmas such as an $N_2$ plasma and an $O_2$ plasma. Surface modifying agents useful in the present invention also include halogens, such as $Cl_2$ and $Br_2$, and halogen containing acids such as HCl and HBr. In addition, surface modifying agents useful in the present invention include Ga, Sb or As containing compounds such as $SbH_3$, $AsH_3$, or organometallics of these materials such as trimethylgallium, trimethylarsine or triethylarsine. Surface modifying agents useful for some aspects of the present invention comprise a gas or a mixture of gases, for example a gas that releases nitrogen to a semiconductor surface. In one embodiment, surface modification agents undergo chemical reactions with a semiconductor surface to form diffusion control groups. Alternatively, surface modification agents may interact with a semiconductor surface in a manner generating diffusion control groups comprising chemiadsorbed and/or physiadsorbed materials, such as atoms, ions and molecules.

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides methods for fabricating doped semiconductor structures having low electrical resistance, selected dopant concentrations and selected dopant depth profiles. The present invention provides methods for controlling the diffusion and electrical activation of semiconductor dopants which exhibit low dopant loss. The methods, devices and device components of the present invention are capable of generating ultra-shallow doped semiconductor structures which exhibit enhanced device performance in semiconductor devices.

FIGS. 2A, 2B and 2C provide schematic representations of several processes of the present invention for making a doped semiconductor structure that provide control over the dopant diffusion and activation. The methods depicted in these figures make use of coupling between a chemically and/or physically modified surface of a semiconductor and bulk phase semiconductor components to control diffusion and electrical activation of implanted semiconductor dopants. The present methods of this aspect of the present invention make use of surface reactions, such as reactions between interstitial semiconductor atoms and free, dangling bonds residing on the semiconductor surface, to reduce and/or control the rate of bulk phase "kick out" substitution reactions that convert immobilized, electrically active dopants into electrically inactive, mobile dopant interstitials. Further, these methods may optionally also adjust important physical and electrical properties of the semiconductor surface, such as surface electrical charge, that affect bulk phase processes associated with dopant diffusion.

In the method shown in FIG. 2A, an exposed surface of a semiconductor, such as a silicon substrate having an atomically clean surface with free, dangling silicon bonds, is treated with a surface modification agent. In one embodiment, surface treatment is provided by exposure of the semiconductor surface to a selected partial pressure of a surface modification agent comprising a gas or combination of gases for a selected exposure time, and optionally at a selected elevated temperature of the semiconductor surface. In one embodiment, surface treatment is provide by exposure of the semiconductor surface to a selected partial pressure of ammonia gas, hydrazine gas or a combination of these, such as a partial pressure selected from the range of about $1 \times 10^{-8}$ Torr to about $1 \times 10^{-5}$ Torr, for an exposure time selected from the range of about 0.5 minutes to about 20 minutes. Elevated semiconductor surface temperatures useful for surface treatment in some applications are selected over the range of about 700 degrees Celsius to about 900 degrees Celsius, and in other applications are selected from the range of about 400 degrees Celsius to about 800 degrees Celsius. In some embodiments, a surface modifying agent comprising a gas, such as ammonia or hydrazine, is exposed to the semiconductor surface using an inert carrier gas such as argon added to provide a total pressure of 1 atmosphere.

A plurality of surface modification agents may be exposed to the semiconductor surface in the form of a gaseous mixture. Alternatively, a plurality of surface modification agents may be exposed to the semiconductor surface in sequential, discrete steps. Sequential exposure to different surface modification agents is useful for achieving layered structures comprising a plurality of diffusion control groups on the semiconductor surface.

Surface treatment generates diffusion control groups on the exposed surface, preferably a selected surface abundance of diffusion control groups on the semiconductor surface. For example, treatment of the semiconductor surface with a partial pressure of ammonia or hydrazine equal to about $3 \times 10^{-6}$ Torr for about 5 minutes at a surface temperature equal to about 800 degrees Celsius results in formation of a surface abundance of diffusion control groups equal to about 1 monolayer. Alternatively, treatment of the semiconductor surface with a partial pressure of ammonia gas or hydrazine gas equal to about $5 \times 10^{-8}$ Torr for about 25 minutes at a surface temperature equal to about 800 degrees Celsius also results in formation of a surface abundance of diffusion control groups equal to about 1 monolayer. To generate surface abundances equal to about 2 or 3 monolayers, treatment conditions corresponding a partial pressure of ammonia or hydrazine equal to about $5 \times 10^{-6}$ Torr, an exposure time equal to about 25 minutes and at surface temperature equal to about 800 degrees Celsius can be used. The present invention also includes embodiments wherein higher partial pressures of ammonia, hydrazine or similar gaseous surface modification agents are used. These embodiments are particularly useful for processing applications employing lower exposure times.

Diffusion control groups selectively adjust important chemical, electrical and physical properties of the surface that may be used to couple chemical reactions and physical/electrical properties at the surface with bulk phase processes that affect dopant diffusion. Diffusion control groups useful in the present invention include silicon nitrogen groups having single and/or double bonds, chemiadsorbed nitrogen or nitrogen-containing compounds, physiadsorbed nitrogen or nitrogen-containing compounds. Such surface bound nitrogen-containing groups are very stable and significant desorption does not typically occur until temperatures above 1100 degrees Celsius.

In one embodiment, formation of a selected surface abundance of diffusion control groups establishes a selected surface loss probability for interstitial semiconductor atoms by eliminating highly reactive free, dangling bonds residing on the exposed surface of a silicon semiconductor. Selection of the appropriate surface abundance of nitrogen-containing diffusion control groups, for example, may be used to select the surface loss probability for interstitial semiconductor atoms over the range of about $1.0 \times 10^{-5}$ to about 1. In another embodiment, formation of a selected surface abundance of diffusion control groups establishes a selected surface electric change and a corresponding electric field in the underlying semiconductor, for example a surface electric field selected over the range of about $1 \times 10^{-5}$ V/cm and $5 \times 10^{-6}$ V/cm. In one embodiment of the present invention, for example, diffusion control groups formed on the semiconductor surface scavenges surface charges, thereby reducing the net electric charge on the surface.

Referring again to FIG. 2A, surface treatment of the exposed semiconductor surface with surface modifying agent(s) and formation of diffusion control groups, the semiconductor is implanted with a dopant, such as boron, or a plurality of dopants. Implantation is followed by annealing to electrically activate the implanted dopant and repair any damage to the semiconductor lattice structure occurring during implantation. During annealing, processes that couple the treated surface of the semiconductor with bulk components, such as semiconductor interstitials operate to control dopant diffusion and activation processes, preferably in a manner establishing a selected dopant concentration depth profile. These processes include loss reactions of interstitials to the treated surface and electrical coupling between the surface and charged defects in the bulk phase. In a preferred embodiment, the surface abundance of diffusion control groups is selected to provide an ultra-shallow doped semiconductor layer and to provide minimized dopant loss.

In the process illustrated in FIG. 2A, the semiconductor surface is treated with one or more surface modification agents prior to implantation with a dopant. An advantage of this method is that treatment before implantation permits annealing to fairly high temperatures (up to about 900 degrees Celsius) during gas exposure (or immediately after, and before implant) which is useful to dissociate some surface modification agents during processing and ensure high-quality diffusion group layer formation. In this context "high-quality diffusion group layer formation" refers to formation of a layer of diffusion control groups that are relatively free of surface defects. In this method, however, the layer of diffusion control groups that is formed on the surface is susceptible to damage during the implantation step.

FIG. 2B provides an alternative process for making a doped semiconductor structure wherein dopant ions are implanted prior to treatment of the semiconductor surface with a surface modification agent. An advantage of methods of the present invention wherein implantation is performed prior to surface treatment with a surface modification agent is that damage to diffusion control groups or layers of diffusion control groups from dopant implantation is avoided. In some embodiments of this aspect of the present invention, surface treatment is preferably conducted at lower temperatures, such as temperatures selected from the range of about 400 degrees Celsius to about 800 degrees Celsius, to avoid implant broadening (i.e. via dopant diffusion) during the surface treatment processing step.

FIG. 2C provides an alternative process for making a doped semiconductor structure wherein the semiconductor surface is treated with one or more surface modification agents prior to and after dopant ions are implanted into the semiconductor. In this embodiment of the present invention, the surface is first exposed to surface modification agents before implantation, together with a second surface treatment step before annealing to remove some or all of the implantation-induced surface defects. In this embodiment, the surface modification agents used in first and second surface treatment steps can be the same, such as ammonia gas, hydrazine gas or a combination of these. Alternatively, the surface modification agents used in first and second surface treatment steps can be different, especially if a several-monolayer-thick layer is formed during the first exposure. In such cases it can be important to pick surface modification agents that diffuse relatively easily through the damaged initial layer, or that are especially effective at removing electrically charged surface defects induced by implantation.

Figure 3A:
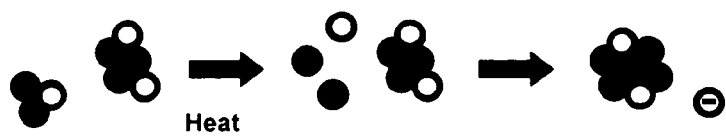
FIGS. 3A and 3B provide schematic diagrams illustrating the behavior of dopants (white open circle markers) and interstitial semiconductor atoms (dark circle markers) in methods of the present invention for making doped semiconductor structures.
Figure 3B:
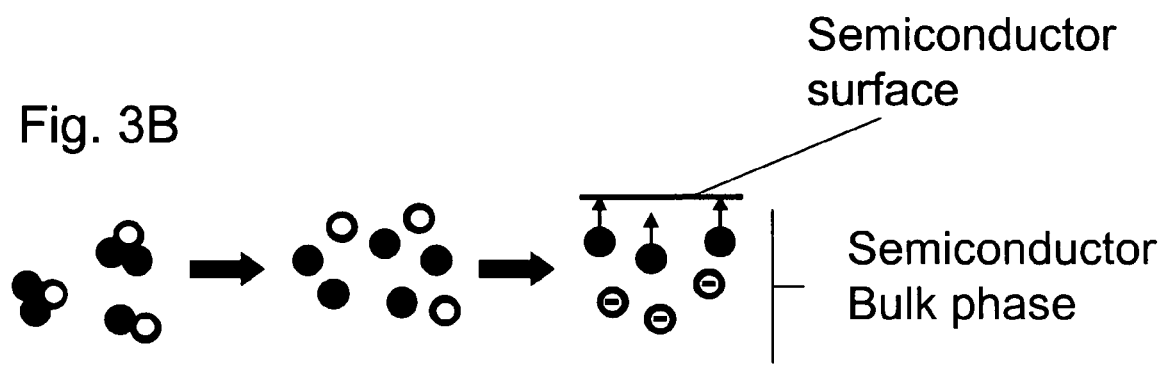

FIGS. 3A and 3B provide schematic diagrams illustrating the behavior of dopants (white open circle markers) and interstitial semiconductor atoms (dark circle markers) in methods of the present invention for making doped semiconductor structures. These figures provide a qualitative description of how a dopant such as boron diffuses and becomes electrically activated during annealing after implantation into a silicon substrate. In this example, dopant behavior is determined primarily by the interplay between lone interstitials (both dopant and Si) and interstitial clusters (containing Si, dopant and/or various mixtures of dopant and Si) that render the lone interstitials immobile. During implantation, numerous lone interstitials are created that diffuse quickly and accrete into clusters. As shown in FIG. 3A, subsequent annealing dissociates these clusters. More heating (for example heating to higher temperatures or for longer times) dissociates more clusters. The Si and dopant interstitials, however, are released together. The Si interstitials tend to keep the dopant atoms from entering and remaining in the desired substitutional atomic sites, thereby promoting unwanted diffusion of the dopant atoms which can significantly broaden the their depth profile. Furthermore protocols that avoid these problems by using lower temperature annealing leave most of the dopant locked within clusters, rendering it electrically inactive.

As shown in FIG. 3B, introduction of a preferential surface sink for Si interstitials results in more electrically activated dopant and reduced dopant diffusion. Importantly, these effects of the introduction of preferential surface sink for Si interstitials result in shallower doped semiconductor layers with very little electrical resistance. The present invention employs two distinct ways to controllably use modifications of chemical, electrical and/or physical characteristics of the semiconductor surface to achieve this result: (1) adjusting the intrinsic loss rate of interstitials to the surface, and (2) reducing the degree of electrical charge built up at the surface.

For example, the loss rate of bulk silicon interstitials through incorporation into the surface ranges from very high at an atomically clean surface with many free, dangling bonds to nearly zero at a surface whose dangling bonds are already saturated via formation of diffusion control groups, such as tightly bonded adsorbates. When the surface loss probability for a silicon interstitial is adjusted between roughly about 1 and about $10^{-4}$, Si interstitials diffuse toward the surface about 100 times faster than the dopant because dopant interstitials are impeded by exchange with the bulk lattice atoms in a way that Si interstitials are not. This preferential loss of Si interstitials keeps electrically active dopant fixed in the lattice by inhibiting the "kick-out" reaction that makes such dopant atoms mobile and electrically inactive.

The interstitial surface loss rate in the present invention may be controlled by selection of the surface abundance of diffusion control groups on the semiconductor surface, for example using adsorbed nitrogen, introduced as ammonia, hydrazine, or a similar simple gas before implantation or the subsequent annealing step. Silicon-nitrogen compounds and/or functional groups do not readily volatilize from the surface, and do not inject interstitials into the underlying bulk when they form. Therefore, these compounds and/or functional groups provide useful diffusion control groups in the present invention. Such nitrogen compounds and functional groups are also quite compatible with conventional manufacturing processes, particularly the temperatures employed during these processes. The composition and surface abundance of diffusion control groups, such as surface nitrogen compounds, and the fraction of surface dangling bonds tied up can be varied by changing the identity of the surface modification agent, the partial pressure of the surface modification agent degree, the exposure time, the temperature of the surface during exposure, or any combination of these variables.

Figure 4:
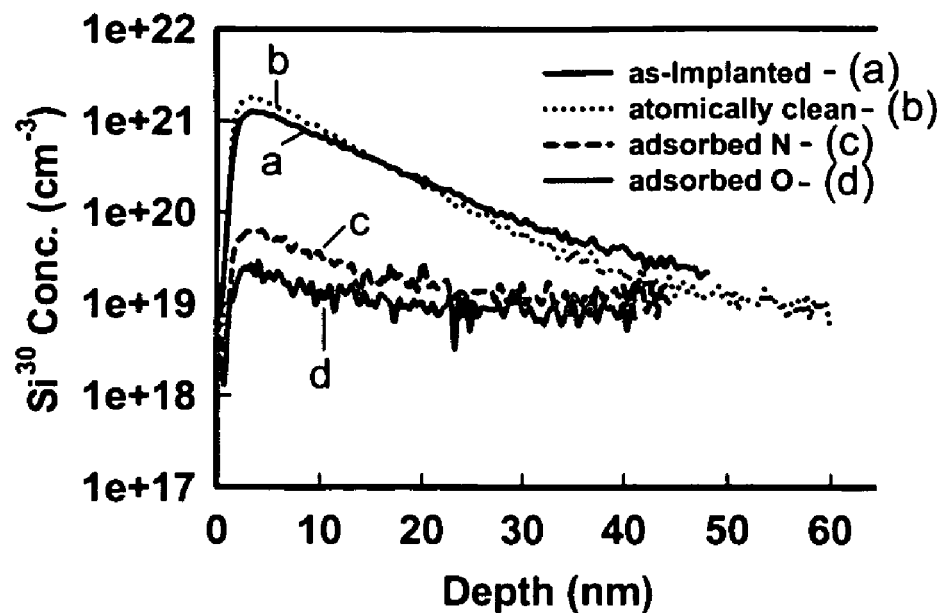
FIG. 4 shows concentration depth profiles of isotopically labeled Si (mass 30) implanted into a Si host lattice depleted in this isotope, as measured by secondary ion mass spectroscopy. The initial profile is shown together with profiles after annealing with various conditions of surface modification.

FIG. 4 shows concentration depth profiles of isotopically labeled Si (mass 30) implanted into a Si host lattice depleted in this isotope, as measured by secondary ion mass spectroscopy. The initial profile is shown together with profiles after annealing with various conditions of surface modification. The annealed concentration depth profile with an atomically clean surface has changed relatively little from the as-implanted profile. The concentration depth profile corresponding to a semiconductor surface having adsorbed N shows more apparent changes relative to the as implanted profile, and the concentration depth profile corresponding to a rather thick layer of adsorbed O shows the greatest degree of change relative to the as implanted profile. These plots illustrate the ability of the present methods to control diffusion by altering the surface loss probability of the semiconductor surface via treatment of the surface with surface modification agents.

Figure 5:
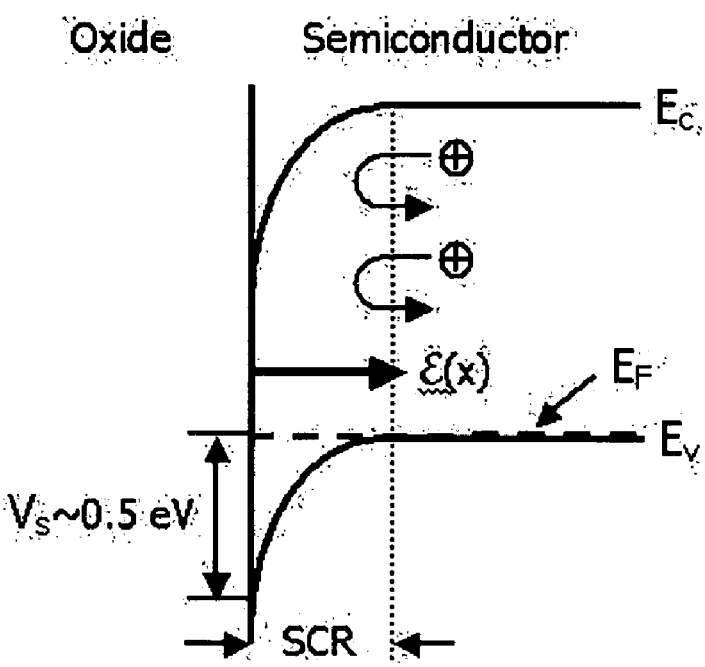
FIG. 5 provides a schematic diagram showing of how electric charge naturally occurring in surface dangling bonds repels interstitials in the bulk once they reach the space charge region (SCR) where the electric field is large.

Electrical charge, either positive or negative, that builds up at dangling bonds on a surface (or at an interface) can couple to the motion of charged defects in the underlying bulk by setting up an electric field very close to the surface that strongly repels the bulk defects. FIG. 5 provides a schematic diagram showing of how electric charge naturally occurring in surface dangling bonds repels interstitials in the bulk once they reach the space charge region (SCR) where the electric field is large. As shown in FIG. 5, strong repulsion in the near-surface region in effect makes the surface more reflecting, thereby changing the concentration depth profile of the bulk defects. In situations where these defects mediate diffusion of dopants within the bulk, this change in interstitial concentration depth profile inevitably induces a corresponding change the dopant concentration depth profile, generally deepening it. As shown by experiments using the optical method of photoreflectance, nitrogen adsorption to a semiconductor surface greatly reduces the charge buildup at a silicon surface at low annealing temperatures, and therefore reduces the magnitude of surface repulsion effects.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. Methods and devices useful for the present methods can include a large number of optional processing elements and steps including, but not limited to, additional implantation steps, additional lower temperature and/or high temperature annealing steps, masking steps, etching steps, oxide formation steps, lithography processing steps, purification processing steps, crystallization processing steps, laser annealing, spike annealing, and arc lamp flash annealing. Further, while boron is exemplified in the present description, it will be clear to those skilled in the art of semiconductors and electronics that the present methods are compatible with other dopant materials.

All references cited in this application are hereby incorporated in their entireties by reference herein to the extent that they are not inconsistent with the disclosure in this application. It will be apparent to one of ordinary skill in the art that methods, devices, device elements, materials, procedures and techniques other than those specifically described herein can be applied to the practice of the invention as broadly disclosed herein without resort to undue experimentation. All art-known functional equivalents of methods, devices, device elements, materials, procedures and techniques specifically described herein are intended to be encompassed by this invention.

When a group of materials, compositions, components or compounds is disclosed herein, it is understood that all individual members of those groups and all subgroups thereof are disclosed separately. When a Markush group or other grouping is used herein, all individual members of the group and all combinations and subcombinations possible of the group are intended to be individually included in the disclosure. Every formulation or combination of components described or exemplified herein can be used to practice the invention, unless otherwise stated. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms.

Example 1

Numerical Simulations and Experimental Observations of Dopant Diffusion and Activation Control Provided by Selective Variation of Surface Loss Probability for Interstitial The ability of the present methods to control dopant diffusion and electrical activation was verified by numerical simulations. Specifically, it is a goal of the present invention to provide methods of making doped semiconductor structures having a selected dopant concentration depth profile. Further, it is a goal of the present invention to provide methods of making ultra-shallow doped semiconductor structures that exhibit low dopant loss and having low electrical resistance.

1. Computational Approach:

To model bulk-surface coupling in semiconductor dopant diffusion, we have developed a computational model for diffusion and dopant activation, primarily for simulating boron implanted in silicon, by adapting the simulator FLOOPS 2000 (by Mark E. Law of the University of Florida and Al Tasch of the University of Texas/Austin). This simulator solves the coupled mass balance equations for interstitial atoms, interstitial clusters, and related defects. These equations have the general form for species j:

$$\frac{\partial N_j}{\partial t} = -\frac{\partial J_j}{\partial x} + G_j \qquad (1)$$

where $N_j$ denotes concentration and $G_j$ is the net generation rate. The flux $J_j$ incorporates terms due to diffusion and drift in response to electric fields. The electric fields are obtained by solution of Poisson's equation. Implementation in FLOOPS offers predictive, rather than merely correlative, utility. Expressions for $G_j$ and $J_j$ were developed by incorporating activation energies obtained by Maximum Likelihood estimation. This method allows accurate simulation of experimental dopant profiles with no freely adjustable parameters.

Figure 6:
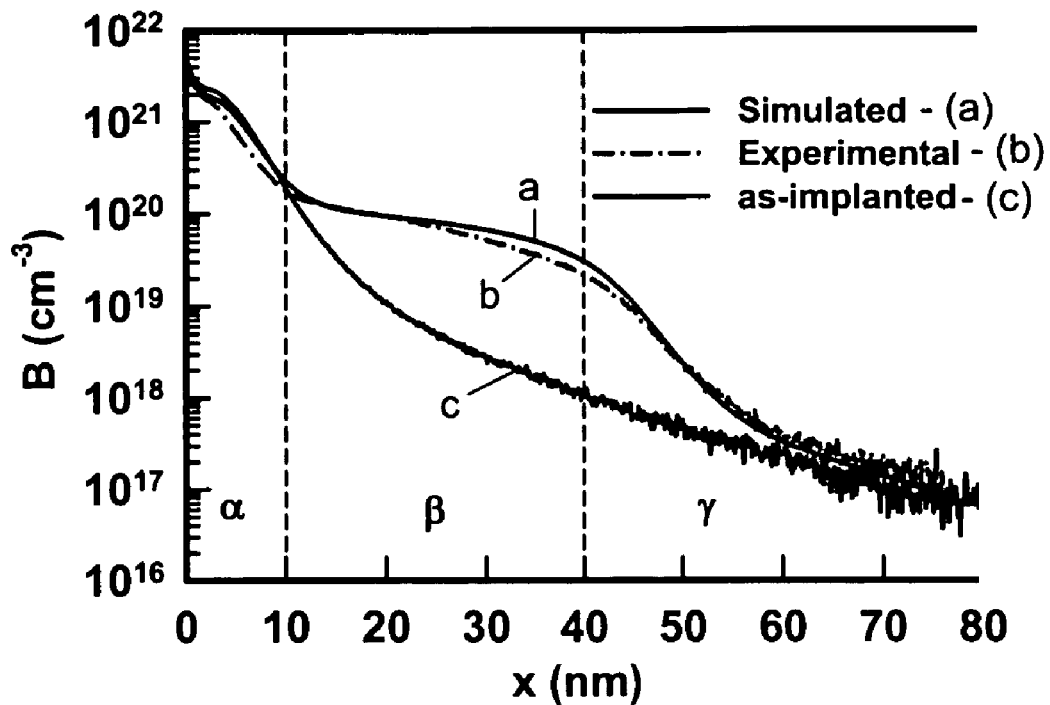
FIG. 6 shows experimental and simulated boron dopant concentration profiles which support the accuracy of our numerical approach for simulating dopant diffusion and electrical activation.

FIG. 6 shows experimentally observed (b) and simulated (a) boron dopant concentration depth profiles which support the accuracy of our numerical approach for simulating dopant diffusion and electrical activation. FIG. 6 also shows the as-implanted (c) dopant concentration depth profile For descriptive purposes, the profile can be divided into α, β, and γ regions that respectively encompass the dopant peak near the surface, the relatively flat region where most TED takes place, and the deep bulk beyond the "shoulder" in the diffused profiles. The junction (at $[B_s]=1\times10^{18}$ cm$^{-3}$) falls within the γ region. The high fidelity agreement between predictions of simulation and experiment have appeared nowhere in the literature and support the accuracy of our simulations. A quantitative parameter sensitivity analysis was also performed to determine which of the activation energies are most important in determining the extent of diffusion and degree of activation. Based on this analysis, the original parameter set was refined for the most sensitive parameters using a Maximum A Posteriori estimation.

2. Primary Mechanisms for Diffusion and Activation

Diffusive behavior in the presence of excess interstitials is determined primarily by the interplay between interstitials (both Si and B) and reservoirs that render the interstitials immobile. These reservoirs include lattice sites and interstitial clusters of various sizes comprising pure Si, pure B, or mixed B and Si. Extensive dopant diffusion would take place very rapidly even at room temperature without the reservoirs or other sinks for interstitials.

During implantation at room temperature, numerous interstitials of B and Si are created. There exists computational and experimental evidence that Si and probably B both diffuse significantly at room temperature. Thus, accretion of interstitials into reservoirs is complete by the end of implantation.

Figure 7:
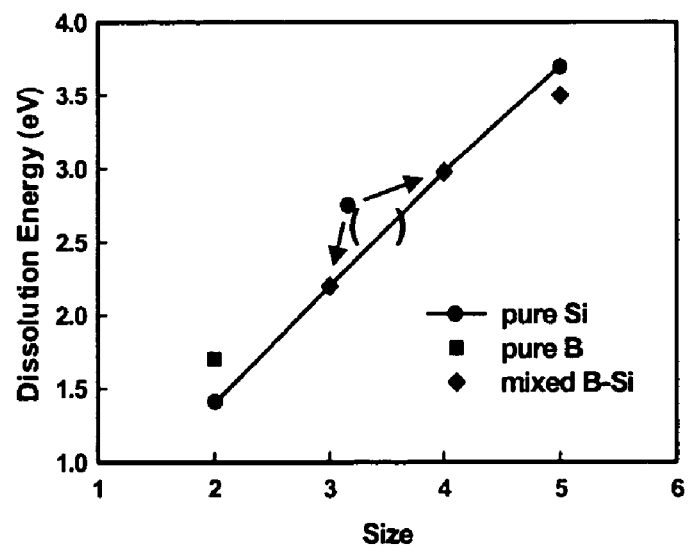
FIG. 7 provides a plot of cluster dissociation energy as a function of number of atoms in the cluster. Points for pure Si and mixed B and Si clusters overlay.

Subsequent annealing dissociates these clusters. FIG. 7 provides a plot of cluster dissociation energy as a function of number of atoms in the cluster. Points for pure Si and mixed B—Si overlay. As shown in FIG. 7, the dissociation energy (and therefore dissociation temperature) increases with cluster size up to a limit of about 3.6 eV.

Annealing in device processing typically uses a linear temperature ramp up to about 1050° C., followed by immediate radiative cool-down. The rising temperature during the ramp up dissociates clusters of progressively larger sizes. The freed interstitials can exchange with lattice atoms. However, in the absence of significant sinks the excess interstitials ultimately accrete onto larger clusters having larger dissociation energies. This process may be considered to be a form of Ostwald ripening. As the temperature approaches the peak, however, the number of clusters releasing boron increases, while the number remaining to absorb boron decreases. These effects conspire to raise the concentration of interstitials significantly. This rise promotes substantial dopant diffusion.

Figure 8:
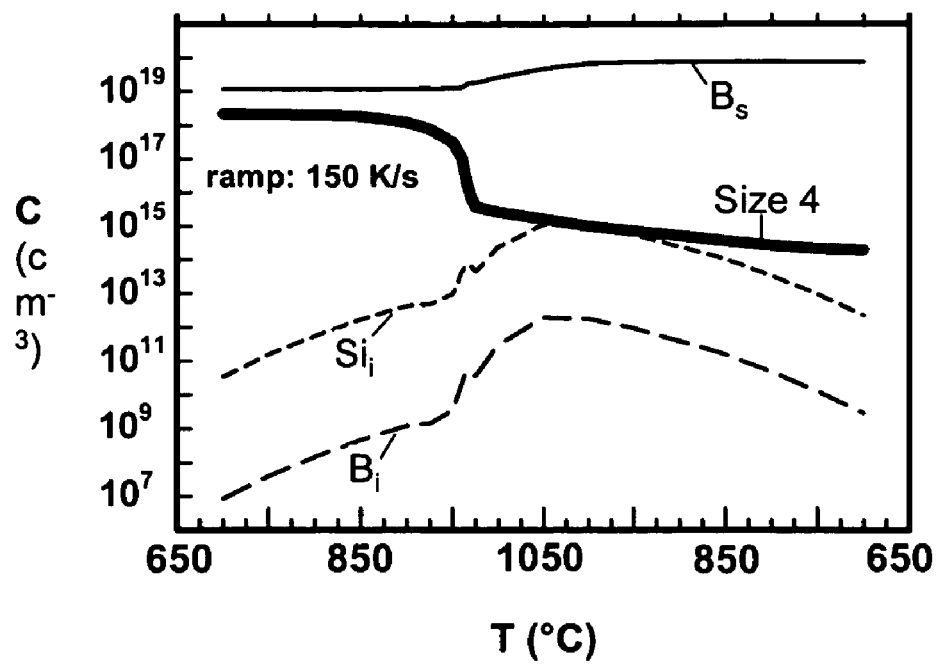
FIG. 8 provides a plot of calculated concentrations (C; number $cm^{-3}$) of $B_s$, $Si_i$, and size 4 clusters as a function of temperature (T; degrees Celsius) for a typical heating program that peaks at 1050° C.

FIG. 8 provides a plot of calculated concentrations (C-cm$^{-3}$) of $B_s$, $B_i$, $Si_i$, and size 4 clusters as a function of temperature (T, Degrees Celsius) for a typical heating program that peaks at 1050° C., and shows this effect as predicted by simulations. In the present description $B_s$ refers to substitutional boron, $B_i$ refers to interstitial boron and $Si_i$ refers to interstitial silicon. The heating protocols used to minimize diffusion leave the majority of boron locked up in large clusters, however, so that the fraction that becomes electrically activated (and therefore useful) remains small. Cluster concentrations are averaged over the α region of FIG. 6 and include the sum of the concentrations of pure B, pure Si, and mixed B and Si species. Note the large decrease in clusters above about 900° C., and the corresponding increase in interstitials that drive TED. These qualitative behaviors also appear in β and γ regions.

3. Simulations Adjusting the Surface "Sink"

Dopant diffusion can be inhibited by providing an additional surface "sink" for Si interstitials. A reduction in Si interstitials ($Si_i$) keeps substitutional boron ($B_s$) immobile and electrically active by inhibiting the "kick-out" reaction:

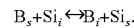

$B_s + Si_i \leftrightarrow B_i + Si_s.$

However, the reduction must not remove too many B interstitials as well, or dopant will be lost to the surface. Dopant loss is undesirable in some applications because it can result in dopant materials not having enough dopant to provide good electrical performance.

Figure 9:
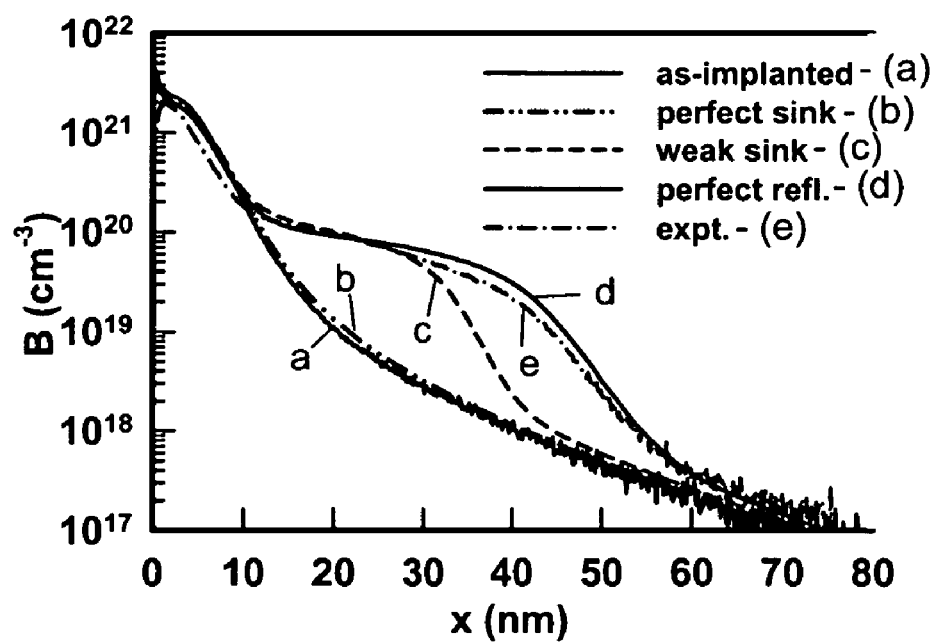
FIG. 9 provides simulated profiles for various surface loss probabilities for interstials that demonstrate the effect of surface loss processes on dopant concentrations.

FIG. 9 provides simulated profiles for various surface loss probabilities for interstials that demonstrate the effect of surface loss processes on dopant concentrations. In these simulations, interstitial loss at the surface boundary was modeled in a simple way. The interstitial flux was calculated assuming a perfect surface sink—i.e., an effective concentration of zero. The resulting flux was then multiplied by a "surface loss probability" S (akin to a sticking probability in conventional surface chemistry) such that $0 \leq S \leq 1$. Several surface loss probabilities were examined including: S equal to 1 (perfect sink–curve b), S equal to $10^{-5}$ (weak sink–curve c), and S equal to 0 (perfect reflector-curve d). FIG. 9 also shows the as-implanted profile (curve a).

Figure 10:
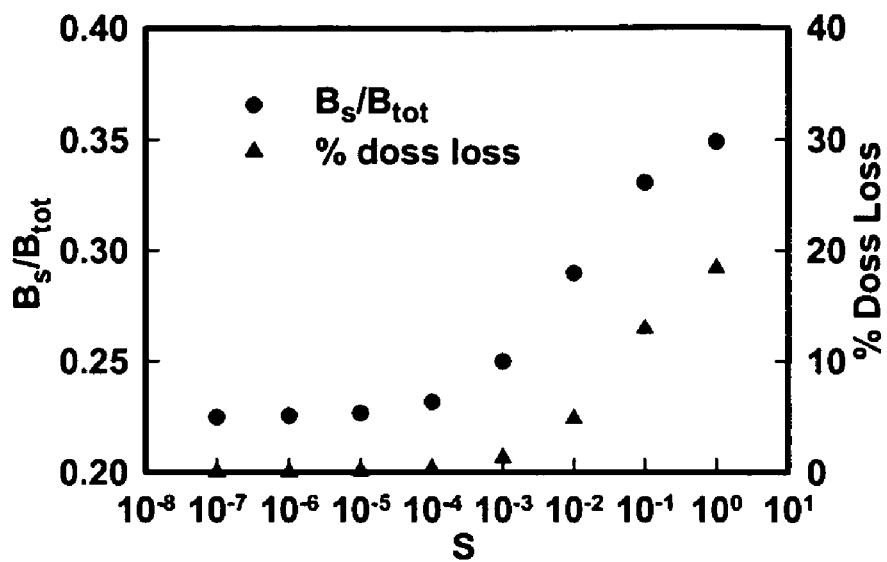
FIG. 10 shows fraction of dopant activated (left, circle markers) and dopant lost (right, triangle markers) vs. surface loss probability.

In the present study, S was set to be equal for Si and B interstitials. FIG. 10 shows fraction of dopant activated (left, circle markers) and lost (right, triangle markers) vs. surface loss probability. As shown in FIG. 10, even small values of S ($<10^{-3}$) induce significant changes. It is important to note that the exact shapes of all these curves depend upon heating rate, maximum temperature, implantation conditions, and other factors that can be modified and optimized. FIG. 10 shows that even small increases in S result in substantial (and beneficial) decreases in diffusion. In addition, FIG. 10 shows that an increase in S substantially increases the fraction of dopant that is active, but at the cost of increased dopant loss. Fortunately, the loss can be compensated to a significant degree by simply implanting more dopant.

Figure 11:
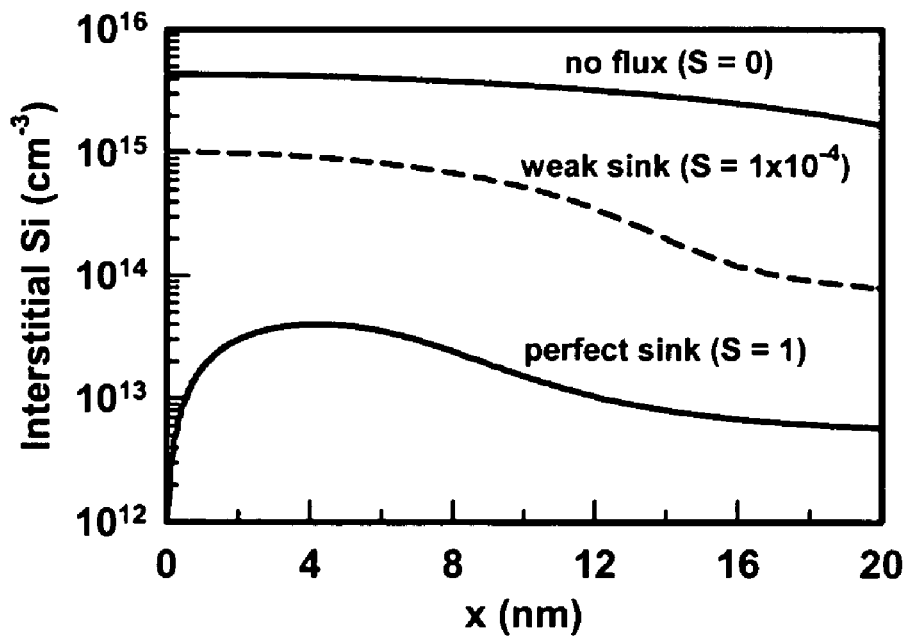
FIG. 11 shows a plot of Si interstitial concentrations near the surface at the maximum temperature in an annealing cycle.

The present study shows that very small increases in the rate of interstitial loss to the surface, for example those corresponding to S five orders of magnitude below unity, can exert large effects on the shape of the dopant profile. The reason is that the interstitials are very close to the surface—within a few tens of nanometers, resulting in strong surface-bulk coupling. Mobile species like interstitials sample the surface often during their diffusional meandering. Small increases in loss probability therefore lead to large increases in loss rate. FIG. 11 shows a plot of Si interstitial concentrations near the surface at the maximum temperature in the annealing cycle, which demonstrates this effect. As shown in FIG. 11, simulations setting $S=10^{-4}$ decreases their concentration by a factor of over four compared to simulations setting $S=0$. This factor increases up to over forty at other times during the annealing cycle.

4. Experimental Observations of Dopant Diffusion and Activation Control

Figure 12:
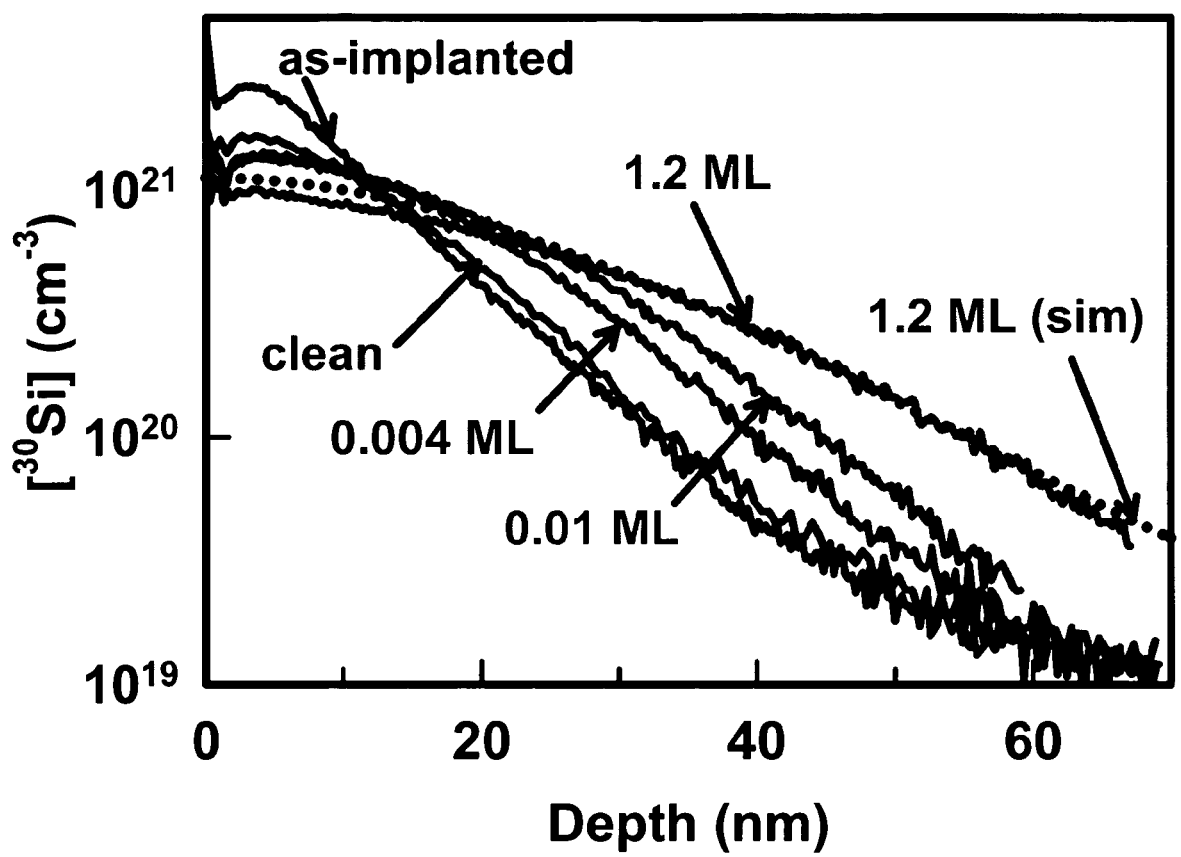
FIG. 12 provides measured concentration depth profiles of isotopically labeled Si (mass 30) implanted into a Si host lattice depleted in this isotope, as measured by secondary ion mass spectroscopy, for a clean (untreated) silicon surface and for silicon surfaces having diffusion control group surface abundances ranging from about 0.004 monolayer to about 1.2 monolayer. The initial implantation profile is shown together with profiles after annealing with various conditions of surface treatment. Also shown is a simulated profile predicted for an abundance of nitrogen containing diffusion control groups equal to 1.2 monolayer.

FIG. 12 provides measured concentration depth profiles of isotopically labeled Si (mass 30) implanted into a Si host lattice depleted in this isotope, as measured by secondary ion mass spectroscopy, for a Si host having an atomically clean (untreated) surface and for silicon hosts having modified surfaces having diffusion control group surface abundances ranging from about 0.004 monolayer to about 1.2 monolayer. The initial implantation profile is shown together with profiles observed after annealing with various conditions of surface treatment. Also shown in FIG. 12 is a simulated profile predicted for a surface abundance of nitrogen-containing diffusion control groups equal to 1.2 monolayer. For experiments evaluating treated semiconductor surfaces, silicon surfaces were exposed to $NH_3$ partial pressures for exposure times selected to generate the appropriate surface abundances of nitrogen containing diffusion control groups. In these experiments, the nitrogen-containing diffusion control groups were very stable and were not observed to desorb from the silicon surface, in contrast to the behavior expected for SiO diffusion control groups. The annealing conditions were an annealing temperature of 980 degrees Celsius for a period of 90 minutes.

As shown in the depth profile in FIG. 12, very little broadening of the implanted $^{30}Si$ depth profile is observed upon annealing the silicon host having atomically clean surface. Significant isotope losses of about 20% are observed, however, upon annealing the Si host having an atomically clean surface. Presumably this lost isotope has migrated to the surface, where SIMS cannot make reliable concentration measurements. In contrast, broadening of the implanted $^{30}Si$ depth profile upon annealing is readily observed for experiments evaluating diffusion when the surface is treated with $NH_3$. As shown in FIG. 12, the extent of broadening in these measurements is observed to be dependent on the surface abundance of the nitrogen-containing diffusion control groups on the silicon surface. Profiles between coverages of 0.01 and 1.0 ML can be superimposed exactly upon each other. At 1.2 ML, spreading increases further as shown in FIG. 12, but then remains constant for higher coverages up to 2.5 ML (the maximum examined here). It is useful to note that significant broadening is even observed for experiments corresponding to an abundance diffusion control groups equal to about 0.004 monolayer. These results clearly show that under some experimental conditions increasing the surface abundance of diffusion control groups results in increased diffusion of the implanted $^{30}Si$. FIG. 12 also shows excellent agreement between experimentally observed and simulated $^{30}Si$ depth profiles corresponding to a surface abundance of diffusion control groups equal to 1.2 monolayer, providing additional support for the accuracy of our numerical approach for simulating dopant diffusion and electrical activation.

The experimental results shown in FIG. 12 demonstrate that selective adjustment of the surface abundance of diffusion control groups in the present invention provides a means of controlling bulk diffusion rates of interstitials in semiconductors during annealing. The observed sensitive control of interstitial diffusion rate is achieved by selective adjustment of the surface loss probability for interstitials provided by variation of the surface abundance of diffusion control groups. In implanted silicon, self-diffusion behavior is determined primarily by the interplay between lone interstitials, the surface, the lattice, and interstitial clusters. The presence of interstitial clusters (with which lone interstitials can exchange) leads to defect concentrations that vary more strongly across the profiles than for unimplanted specimens. Thus, quantitative comparison of the surface loss rates at various adsorption levels is best done through the surface loss probability S. The SIMS profiles were analyzed by Maximum Likelihood estimation to determine S for interstitials as a function of nitrogen concentration. The model for these interactions was implemented using the profile simulator FLOOPS 2000 with key rate expressions and rate parameters developed by our laboratory. A typical profile fit appears in FIG. 12 for 1.2 ML.

Figure 13:
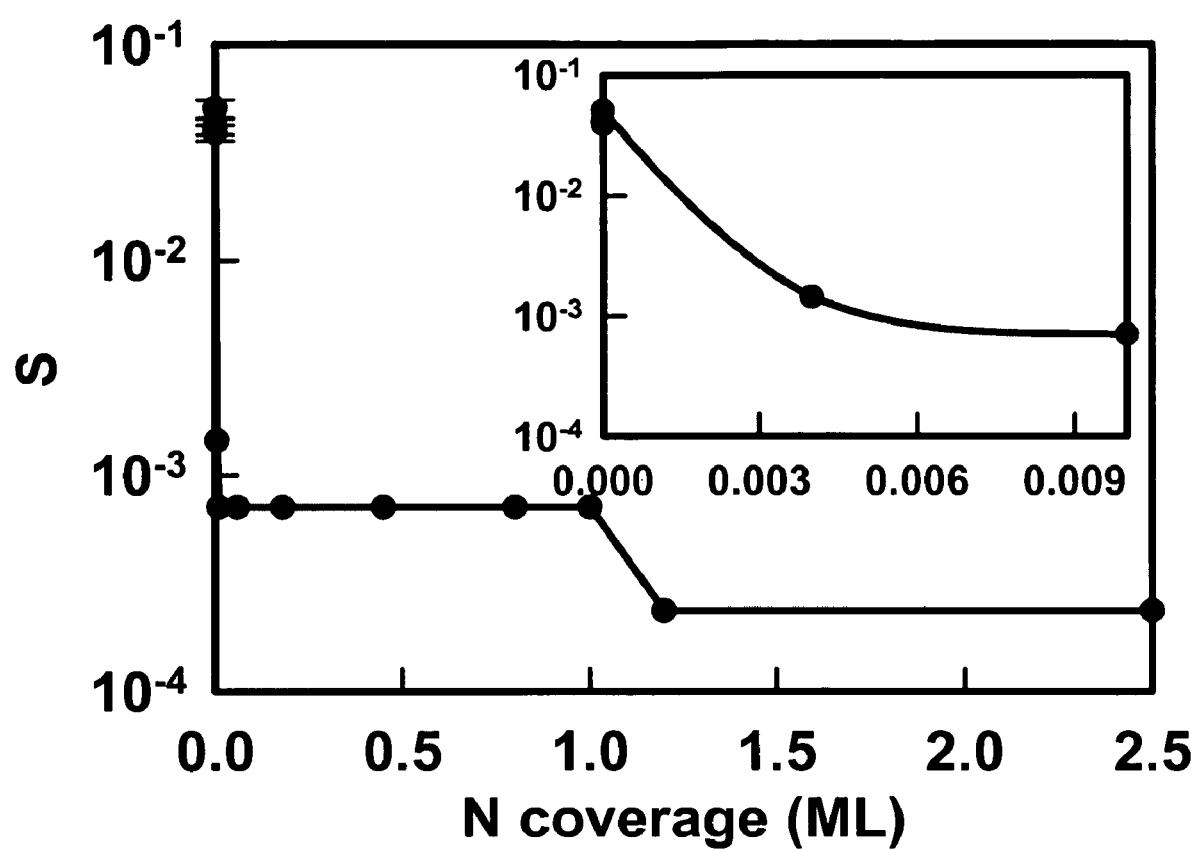
FIG. 13 provides a plot of the surface loss probability (S; y axis; also referred to as the surface annihilation probability) for $^{30}Si$ interstitials as a function of the surface abundance of nitrogen containing diffusion control groups (N coverage; x axis; provided in units of monolayer) and the inset in FIG. 13 shows a portion of this data presented using a smaller X axis scale.

FIG. 13 provides a plot of the surface loss probability (S; y axis; also referred to as the surface annihilation probability) for $^{30}Si$ interstitials as a function of the surface abundance of nitrogen-containing diffusion control groups (N coverage; x axis; provided in units of monolayer) and the inset in FIG. 13 shows a portion of this data presented using a smaller X axis scale. The surface loss probabilities shown in FIG. 13 were calculated by modeling the observed $^{30}Si$ depth profiles corresponding to a variety of surface abundances of nitrogen-containing diffusion control groups. As shown in FIG. 13, the surface loss probability for interstitials decreases by about a factor of 100 between an atomically clean surface and a surface having an abundance of diffusion control groups equal to about 0.01 monolayers. S varies from a high near 0.05 on the clean surface to a low near 0.0003 above 1 ML. Most of the decrease (nearly two orders of magnitude) occurs between 0 and 0.01 ML. The reason for this significant change in surface loss probability is that diffusion control groups interact with the exposed silicon surface in a manner which eliminates or renders inactive at least a portion of the surface dangling Si bonds present. Therefore, the extent of elimination and/or inactivation of the surface dangling Si bonds caused by providing diffusion control groups establishes the surface loss probability of interstitials.

Figure 14:
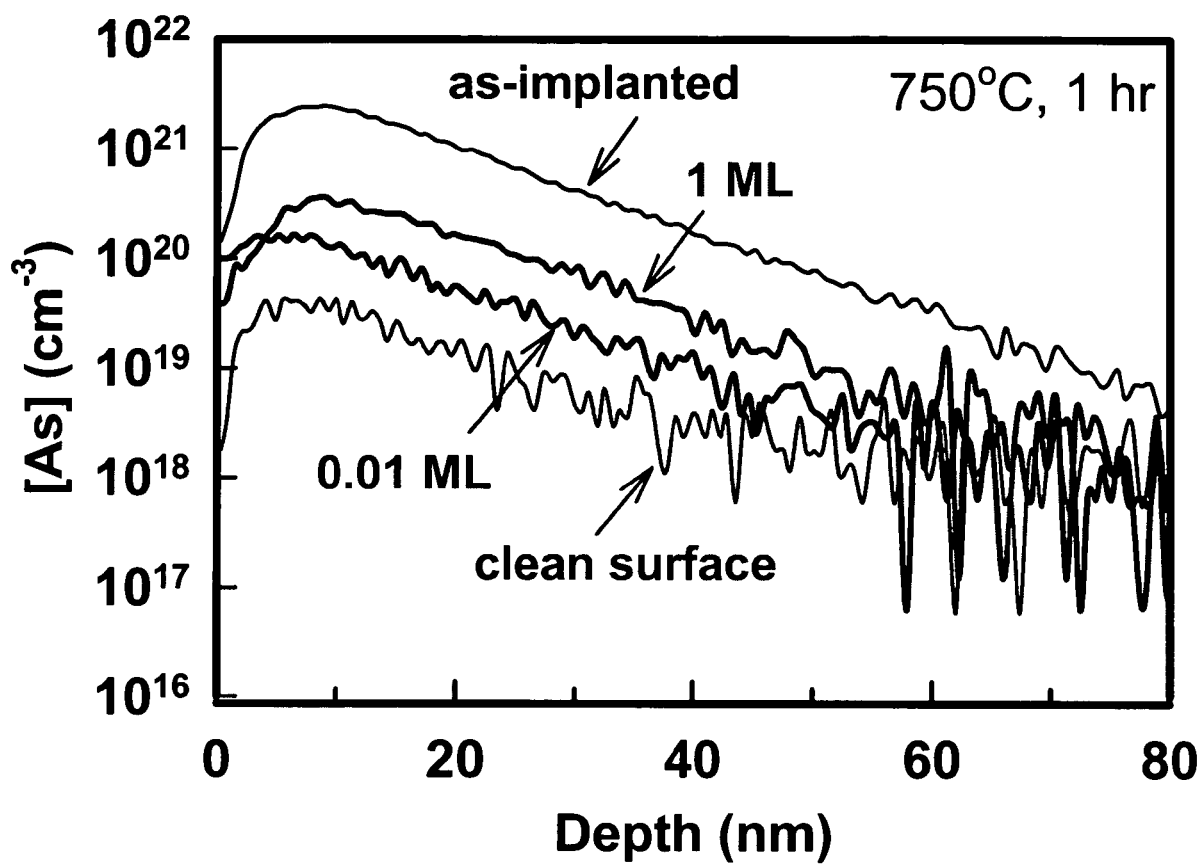
FIG. 14 shows concentration depth profiles of arsenic (As) dopant (mass 30) implanted into a Si host lattice for a clean (untreated) silicon surface and for silicon surfaces having diffusion control group surface abundances ranging from about 0.01 monolayer to about 1 monolayer.

FIG. 14 shows concentration depth profiles of arsenic (As) dopant implanted into a Si host lattice for a clean (untreated) silicon surface and for silicon surfaces having diffusion control group surface abundances ranging from about 0.01 monolayer to about 1 monolayer. In these experiments, nitrogen-containing diffusion control groups were formed on the silicon surface by exposure to partial pressures of $NH_3$ for selected exposure times. Implantation conditions were an implantation energy equal to 2 keV and ion beam intensity $2 \times 10^{15}$ ions per centimeter squared. FIG. 14 shows the as-implanted As concentration depth profile (curve a), an As concentration depth profile upon annealing corresponding to an atomically clean surface and As concentration depth profile upon annealing corresponding to surface abundances of nitrogen-containing diffusion control groups equal to 0.1 monolayer and 1 monolayer.

As shown in FIG. 14, the presence of diffusion control groups on the silicon surface gives rise to more broad concentration depth profiles of arsenic (As) dopant than that observed for the atomically clean surface. The extent of broadening in the measured concentration depth profiles is observed to be proportional to the surface abundance of the nitrogen-containing diffusion control groups on the silicon surface. In addition, a comparison of the areas under the plots of the curves shown in FIG. 14 shows that the presence of diffusion control groups on the silicon surface also results in larger net dopant amounts in the silicon host after annealing (i.e. less dopant loss to the surface). Particularly, the net dopant amount in the Si host is observed to be proportional to the surface abundance of the nitrogen-containing diffusion control groups on the silicon surface and is due to a suppression of dopant loss to the surface due to presence of diffusion control groups.

Figure 15:
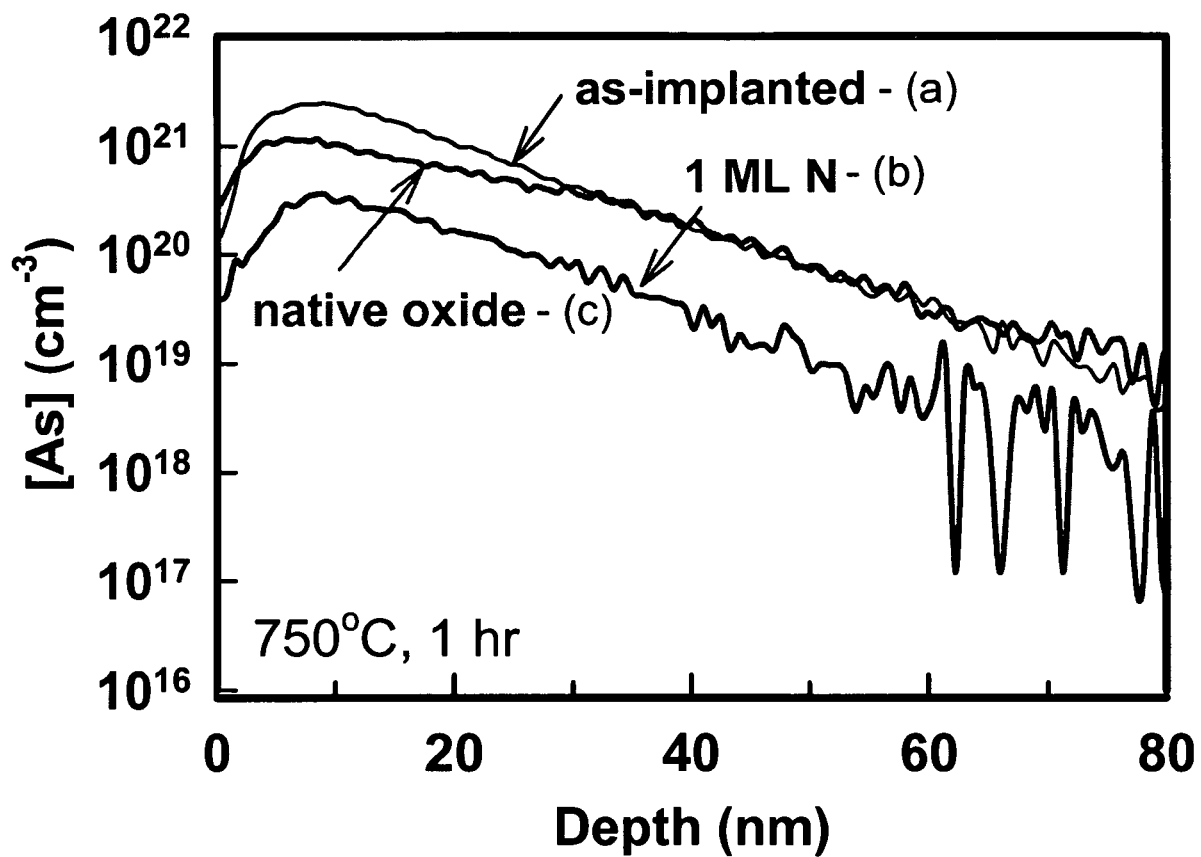
FIG. 15 shows concentration depth profiles of arsenic (As) dopant implanted into a Si host lattice as-implanted, and upon annealing for a silicon surface having nitrogen-containing diffusion control groups and for a silicon surface having a diffusion control groups comprising a native oxide layer. The concentration depth profile for the nitrogen-containing diffusion groups correspond to a surface abundance of about 1 monolayer.

The identity and composition of diffusion control groups used in the present methods affects the surface loss probability of interstitials and the dopant concentration profiles observed upon implantation and annealing. FIG. 15 shows concentration depth profiles of arsenic (As) dopant implanted into a Si host lattice as-implanted (curve a), and upon annealing for a silicon surface having nitrogen-containing diffusion control groups (curve b) and for a silicon surface having a diffusion control groups comprising a native oxide layer (curve c). The concentration depth profile for the nitrogen-containing diffusion groups corresponds to a surface abundance of about 1 monolayer. As shown in FIG. 15, the dopant concentration profile corresponding to the native oxide layer is significantly broader than the profile corresponding to the nitrogen-containing diffusion control groups. This indicates that the presence of the native oxide layer results in a lower surface loss probability for interstitials than the 1 monolayer of nitrogen-containing diffusion control groups. Therefore, selection of appropriate surface modification agents and diffusion control groups in the present methods provides another means of controlling dopant diffusion and electrical activation in implanted and annealed semiconductor materials.

5. Adjusting the Initial Size Distribution of Clusters

The beneficial effects of adjusting S are greatly augmented if dopant can be prevented from accreting into large interstitial clusters that fail to dissociate during heating. Currently, little is done in practical manufacturing to control or even measure cluster sizes. Conventional implantation takes place at room temperature where interstitials of both B and Si are mobile, and requires tens of minutes. Thus, once the first few clusters begin to form, they continue to grow during implantation to sizes too large to dissociate. Much of the dopant becomes irretrievably locked up.

Carrying out implantation over much shorter time periods increases the instantaneous interstitial concentration and induces many small clusters to form rather than relatively few large ones. Implanting at temperatures sufficiently low to freeze interstitial motion accomplishes a similar effect. Upon rapid but gentle heating, the suddenly-mobile interstitials quickly form many small clusters. By either method, a greater fraction of dopant is liberated from clusters during a typical heating cycle because smaller clusters dissociate at lower temperatures. With the S adjusted to remove Si interstitials, the fraction of dopant becoming electrically active is increase greatly. Simulations carried out in this study show these effects, with degrees of electrical activation nearly a factor of two greater than provided by conventional procedures.

Example 2

The Use of Nitrogen Release Gases as Surface Modification Agents in the Methods of the Present Invention Gases that release nitrogen to semiconductor surfaces, such as ammonia or hydrazine, comprise particularly useful surface modification agents in the methods of the present invention. Exposure of a semiconductor surface to surface modifying groups that release nitrogen, under some conditions, forms nitride ($Si_3N_4$) on the treated surface. This mechanism of surface treatment avoids two major problems that plague surface manipulation using surface modification agents comprising oxygen. First, silicon-nitrogen compounds do not readily volatilize from the Si surface. Second, nitride growth injects vacancies instead of interstitials into the underlying Si. The lack of volatilization removes an important constraint in controlling surface-bulk coupling, since in principle no nitrogen-containing gas would need to be added during heating for nitride replenishment. And if such a gas were added, the vacancies injected would tend to recombine with Si or B interstitials in a way that reduces rather than exacerbates dopant diffusion and loss.

The chemistry of nitrogen compounds on Si has been studied in considerable depth for over a decade. The literature includes work on many compounds which can provide useful surface modification agents in the present invention, such as ammonia, nitric oxide, nitrous oxide, hydrazine, azomethane, dimethylhydrazine, and dinitrogen. In many cases, with the exception of dinitrogen, the adsorbed gas dissociates when brought into contact with the exposed semiconductor surface at about room temperature. Excess hydrogen and/or carbon desorb at higher temperatures, followed by nitridation of the near-surface bulk between 400 and 800° C. The interface state density is quite modest, suggesting that Fermi pinning effects should be small enough so that the effects of varying S on surface interstitial flux will dominate.

Clearly the amount of nitride formed, its precise stoichiometry, and the nature of the resulting Si-nitride interface can be varied in the methods of the present invention by changing the type of nitrogen-containing gas and the degree of exposure (i.e. partial pressure and/or exposure time). This fact, coupled with the modest formation temperatures involved, suggests that exposure of Si to such gases at modest temperatures after implantation (and before final annealing) yield boundary conditions whose value of S can be continuously varied over a fairly wide and useful range.

Example 3

Controlling Defect Concentrations in Bulk Semiconductor Materials Via Surface Adsorption In addition to providing a means of controlling diffusion and activation of dopants implanted in semiconductor materials, the methods of the present invention also provide a means of controlling the concentrations and concentration depth profiles of defects in bulk semiconductors. Specific modification of the surfaces of undersaturated semiconductor materials, such as heated unimplanted semiconductors, by treatment with surface modifying agents provides a means of selectively controlling the concentrations and concentration depth profiles of vacancies and interstitials in bulk semiconductors. In such undersaturated semiconductor materials, dangling, free bonds at the surface act as sources of defects by releasing interstitials into the bulk under some conditions. The strength of this source of interstitials is selectable in the present invention by modifying the composition of the surface, for example by selective adjustment of the abundance or activity of dangling, free bonds at the surface via treatment of the surface with surface modification agents. Self-diffusion measurements in silicon, for example, show that defect concentrations deep in the bulk [e.g. deeper than or equal to about 0.5 μm] can be varied controllably over several orders of magnitude through surface nitrogen adsorption at the level of only 1% of a monolayer.

Figure 16:
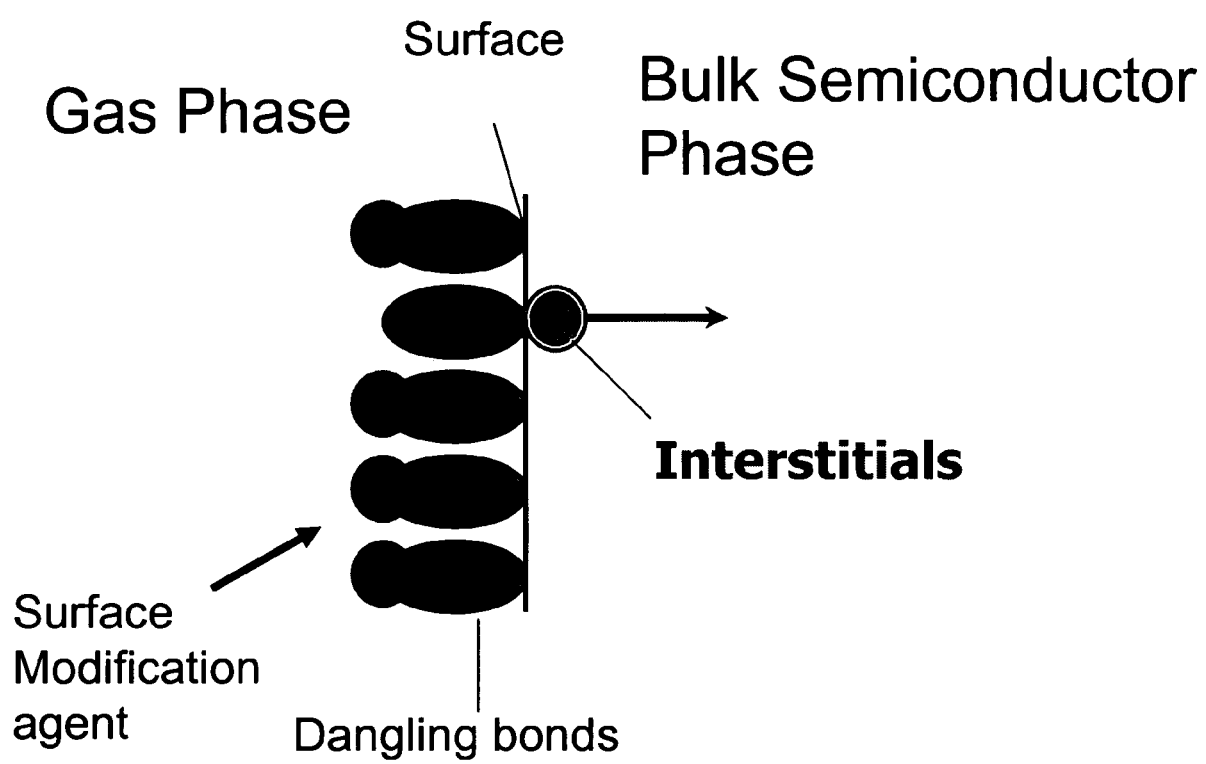
FIG. 16 provides a schematic diagram illustrating the conceptual basis of the present methods for controlling defects in undersaturated semiconductor materials.

FIG. 16 provides a schematic diagram illustrating the conceptual basis of the present methods for controlling defects in undersaturated semiconductor materials. As shown in FIG. 16, dangling bonds residing at the semiconductor surface provide a source of defects, such as interstitials, to the bulk phase of undersaturated semiconductor materials. The strength of this source of defects is proportional to the number of dangling bonds present at the semiconductor surface. Exposure of the semiconductor surface to one or more surface modification agents results in a least partial elimination of the dangling bonds and/or processes that render the dangling bonds incapable of releasing defects into the bulk, a process referred herein as "inactivation". Exposure to surface modification agent(s) may result in chemiadsorbed and/or physiadsorbed molecules on the semiconductor surface which eliminate dangling bonds and/or render them inactive with respect to release of defects into the bulk semiconductor. Alternatively, surface modification agents may chemically react with dangling bonds thereby eliminating them or inactivating them with respect to release of defects into the bulk. Control of defect concentrations and depth profiles in the present methods is provided by adjusting the composition of the surface by treatment with surface modification agents, for example by selective adjustment of the surface abundance of dangling bonds.

The present approach is easily implemented and avoids the problems with consumption, damage, or foreign atom incorporation that plague other methods for defect control. Such novel defect engineering methods of the present invention are useful for fabricating semiconductor materials useful for wide a range of applications including, but not limited to, catalyst materials and semiconductor based electronic devices. For example, methods of generating extra vacancies or interstitials greatly speed dopant motion in bulk semiconductors, which decreases processing time and/or allows lower processing temperatures in some fabrication applications.

1. Introduction

In many applications, the technologically useful properties of a solid depend upon the types and concentrations of the defects it contains. For example, defects such as vacancies and interstitial atoms, control foreign-atom diffusion in semiconductors used for microelectronic devices. Such devices would be nearly impossible to fabricate without the diffusion of these atoms, whether they be beneficial dopants or harmful contaminants. Defects affect the performance of photo-active devices, the effectiveness of catalysts, and the efficiency of devices for converting sunlight to electrical power. Bulk defect creation, destruction, and diffusion near surfaces play an important role in catalysis and adsorption by metal oxides. Examples include $V_2O_5$ for selective oxidation of hydrocarbons, $TiO_2$ for $NO_x$ reactions, and supported metals on $TiO_2$ for a variety of reactions. Bulk defect concentrations also affect photocatalysis rates, since the defects serve as unwanted electron-hole recombination centers. In sensors, bulk defect diffusion governs the behavior of solid-state electrolytes such as $ZrO_2$.

As a result of the importance of bulk defects in these applications, various forms of "defect engineering" have been developed over the years to control the concentration and distribution of bulk defects in semiconductor materials. However, these approaches sometimes affect material properties adversely through consumption or damage of the solid, as with surface oxidation and ion implantation, or through the incorporation of impurity atoms. Therefore, a need currently exists in the art for improved methods of controlling bulk defects in semiconductor materials. The methods of the present invention provide a fundamentally different approach to controlling bulk defects in semiconductors by changing surface composition via treatment with surface modification agents. For example, the present work shows that minute levels of surface adsorption can control defect concentration over wide ranges through both annihilation and generation. This new approach offers an easily implemented means for defect engineering, and avoids the problems with consumption, damage, or foreign atom incorporation that plague other methods for defect control. In addition, many applications of defect engineering focus on bulk regions in close proximity to surfaces, so defect engineering via manipulating surface composition has particular practical relevance.

2. Experimental

To demonstrate the utility of the present methods for controlling bulk defects in semiconductor, self-diffusion rates in silicon were determined by tracking isotope motion. Defects such as vacancies and interstitials mediate self-diffusion within silicon, and the measured rate scales directly with the concentrations of these species. Defects in solids can be generated and destroyed by various pathways both on the surface and within the bulk. In strongly bonded solids such as silicon, the surface typically offers more efficient pathways because fewer bonds need to be broken. The premise of the present experimental approach is that controlling the surface defect generation or annihilation rate therefore exerts strong effects on the bulk defect concentration, and therefore on the measured diffusion profiles. This approach is particularly relevant in undersaturated materials, such as unimplanted semiconductors.

To demonstrate control of the surface generation rate, we measured diffusion rates as a function of adsorbed nitrogen surface abundance under conditions of defect undersaturation. Specifically, adsorbed nitrogen was provided at various surface abundances via exposure of the surface of unimplanted silicon to a surface modification agent comprising $NH_3$. The experiments employed a well-known isotopic heterostructure technique, in which a layer of silicon is grown epitaxially on a substrate having a different ratio of the isotopes $^{28}Si$ and $^{30}Si$. A step concentration profile of the minority isotope thereby forms at the interface, and diffusional spreading of this profile is monitored after heating with secondary ion mass spectroscopy (SIMS). Since the equilibrium concentrations of both vacancies and interstitials increase with temperature, heating produces a solid that is undersaturated in both defect types. The rate of surface defect generation affects the degree of undersaturation and therefore the diffusion rate. Our experiments were performed in an ultrahigh vacuum environment. In this well-controlled environment, the adsorbate concentration could be controlled precisely to levels far below one monolayer. By contrast, the silicon self-diffusion measurements reported in the literature have been performed at atmospheric pressure. Although the gaseous streams comprised nitrogen or argon and were nominally inert, such streams invariably contain low, ill-defined levels of reactive gases such as water or oxygen. As we will show in the case of Si(100), less than 1% of a monolayer is sufficient to greatly affect the measured diffusion profiles. An ultrahigh vacuum environment proved to be a particularly straightforward means for obtaining and measuring adsorbate coverages down to this level.

In the present study, the epitaxial Si layers were grown by low-pressure chemical vapor deposition atop natural-abundance Si substrates within 1° of the (100) orientation. Step-function isotopic heterostructures were obtained as 4-inch n-doped wafers from Isonics Corporation. The concentration of $^{30}Si$ within the grown layer was 0.002%, compared to the natural abundance of 3.10%. For experiments with unimplanted material, arsenic served as the dopant, and was present at a uniform level of $1 \times 10^{19}$ $cm^{-3}$ throughout the step function structure. For experiments with implanted material, the substrate wafers were p-type, doped with boron to a level of $1 \times 10^{19}$ $cm^{-3}$. The grown layer was also B-doped, but to a level of $10^{15}$ $cm^{-3}$.

Specimens of approximate dimensions 1.7 cm×0.7 cm were cut from the original wafers and mounted for resistive heating by using Ta clips. Temperature was monitored with a chromel-alumel thermocouple junction pressed into a small pit drilled into the back of the specimen. Specimens were degreased by successive 5-min rinsing cycles in electronic-grade trichloroethylene, acetone, and methanol. Native oxide was removed with 49% HF followed by rinsing in deionized water for 1 min. Immediately thereafter, the specimens were mounted in the ultrahigh vacuum chamber, which was quickly pumped down to $10^{-9}$ torr to avoid significant native oxide formation.

Specimen surfaces were exposed to $NH_3$ (99.99%) at 800° C. Control experiments showed that no significant profile spreading occurred during adsorption.

The vacuum chamber was equipped with Auger electron spectroscopy to determine nitrogen coverage. For very low coverages (<0.01 ML) below the detection limit of Auger spectroscopy, coverages were estimated by interpolation of coverage vs. exposure data between zero exposure (the clean surface) and small detectable coverages obtained at higher exposures.

Isotope profiles were measured ex situ with secondary ion mass spectroscopy (SIMS) using a PHI TRIFT III instrument with a cesium ion beam. Multiple SIMS measurements were made for each specimen to improve the accuracy of parameter determination.

The ultrahigh vacuum chamber was equipped with a variable energy ion gun (up to 2 keV) for ion implantation. Implantation was accomplished using $SiH_4$ gas that was enriched to roughly 90% in the $^{30}Si$ isotope. The gas was obtained from Voltaix Corp, with chemical impurities consisting primarily of carbon-containing species. Implanting into the isotopically depleted layer decreased the background concentration of $^{30}Si$ and thereby increased the sensitivity of the SIMS measurement.

3. Results

Figure 17:
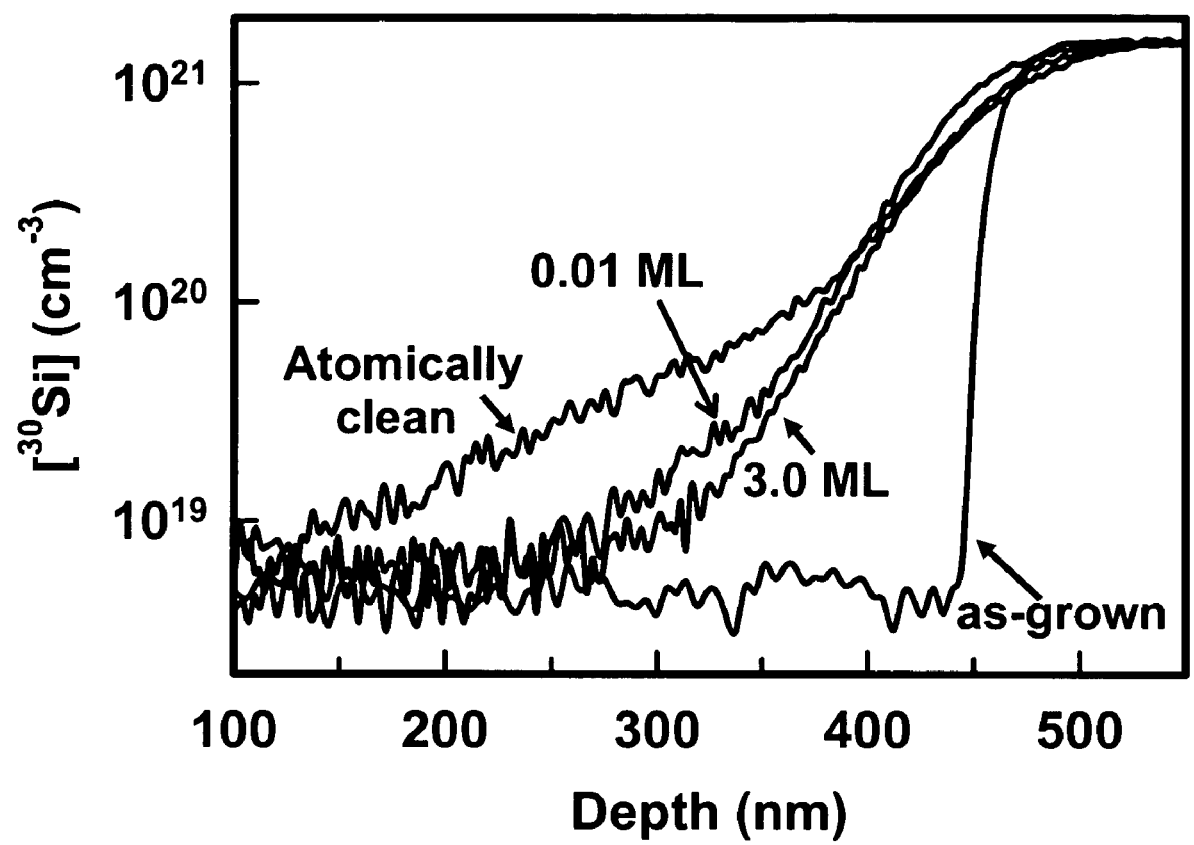
FIG. 17 shows example series of concentration depth profiles of $^{30}Si$, acquired using SIMS, for unimplanted (i.e., undersaturated) specimens. The concentration of nitrogen-containing diffusion control groups varied between zero (an atomically clean surface) and 3 monolayers (ML).

FIG. 17 shows example series of concentration depth profiles of $^{30}Si$, acquired using SIMS, for unimplanted (i.e., undersaturated) specimens. The concentration of adsorbed nitrogen was varied between zero (an atomically clean surface) and 3 monolayers (ML). The diffusion profiles differ substantially, and exhibit the most spreading for the atomically clean surface. Surprisingly, a concentration of only 0.01 ML greatly reduces spreading. Notice that the differences in the profiles extend down to the heterojunction interface, which is nearly 0.5 μm from the surface. These results show that manipulation of the composition of the surface of the Si host provides control of defect concentrations deep within the bulk. In one embodiment, the surface abundance of chemiadsorbed and/or physiadsorbed molecules on the treated semiconductor surface is selected from the range of about $5 \times 10^{13}$ molecules $cm^{-2}$ to about $2 \times 10^{15}$ molecules $cm^{-2}$, more preferably for some applications $4 \times 10^{14}$ molecules $cm^{-2}$ to about $9 \times 10^{14}$ molecules $cm^{-2}$. Alternatively, the surface abundance of chemiadsorbed and/or physiadsorbed molecules on the treated semiconductor surface is selected from the range of about 0.1 to about 3 monolayers, and more preferably for some applications 0.7 monolayers to about 1.3 monolayers.

Diffusion of the $^{30}Si$ isotope involves diffusion of both vacancies and interstitials defects and, in the case of interstitials, exchange with atoms in the host lattice. Concentration depth profiles such as those in FIG. 17 can be analyzed numerically to obtain the effective diffusion coefficient D that describes profile spreading. For profiles with error function shapes (such as for 3 ML in FIG. 17), D represents the proportionality constant that appears in Fick's second law for transient diffusion. Some profiles have non-error function shapes, however (such as for 0 ML), which directly manifest the presence of a highly mobile species that periodically exchanges with the lattice. D was derived by numerical simulation of combined defect hopping and exchange.

Figure 18:
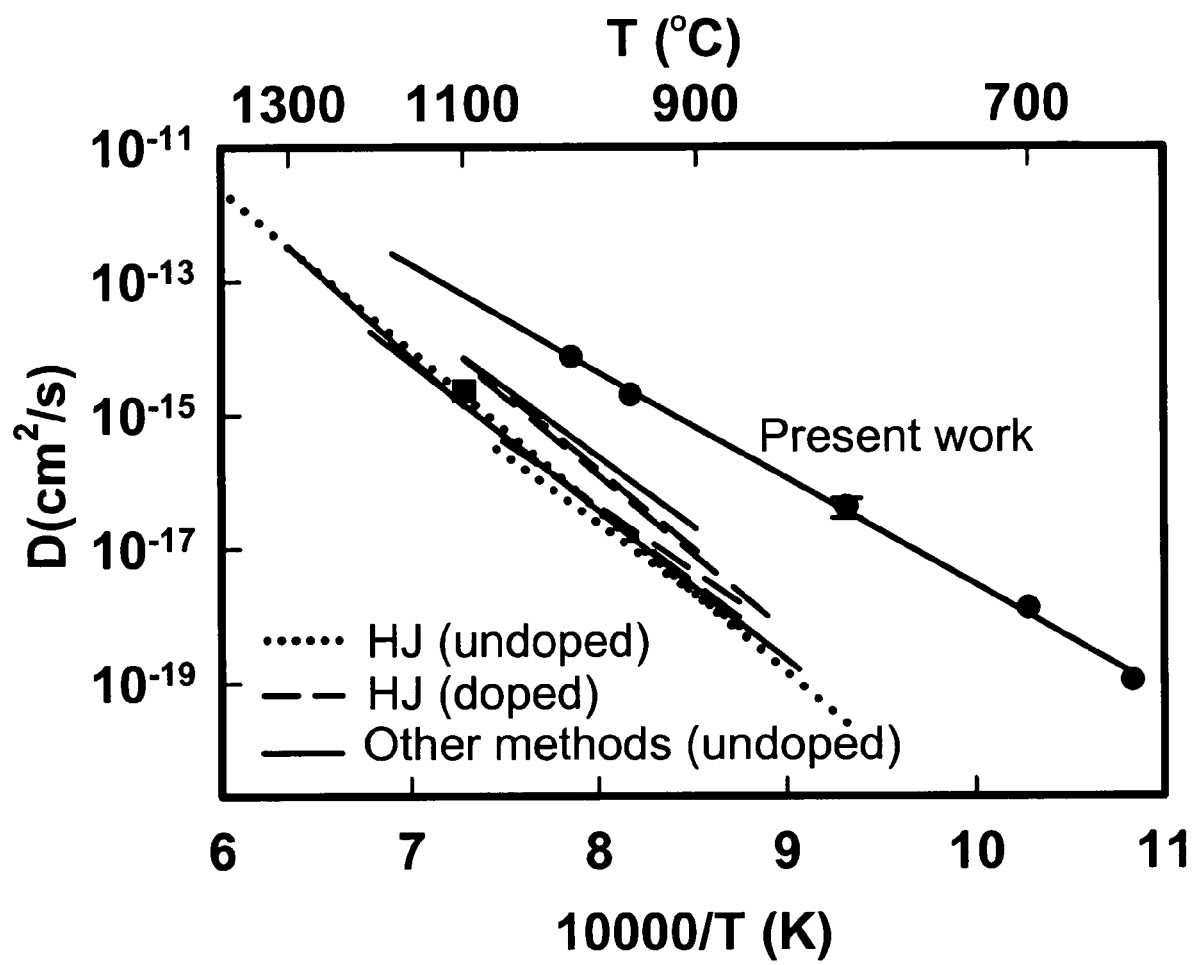
FIG. 18 shows the temperature dependence of the diffusion coefficient (D) in Arrhenius form.

FIG. 18 shows the temperature dependence of the diffusion coefficient (D) in Arrhenius form. Our numbers are two to four orders of magnitude larger than those reported in the substantial body of published work, and imply a correspondingly larger defect concentration that must be caused by the surface. We obtain an activation energy of 3.12±0.05 eV and a pre-exponential factor of 0.01 $cm^2/s$. The activation energy falls well below the values of 4.0 to 5.0 eV that characterize previously published work. Note that doping type and level affects D in silicon due to the interaction of charged defects with the Fermi level. This effect accounts for much of the spread in the literature reports shown in FIG. 18. However, our measurements (for n-doped Si) fall far outside the range of all these measurements, so that Fermi level effects can be excluded as the primary cause. Furthermore, FIG. 18 shows overlapping data points measured with 1 and 3 ML of adsorbed nitrogen present (D=$2.5 \times 10^{-15}$ and $2.3 \times 10^{-15}$ $cm^2/s$, respectively). The points falls nearly two orders of magnitude below our clean surface results, and lie squarely in the mid-range of previously published data. This latter agreement suggests that there was significant surface adsorption in past studies. Note that only 0.01 ML of adsorbed nitrogen yielded value of D only slightly higher ($3.5 \times 10^{-15}$ cm$^2$/s) than 1 and 3 ML.

For adsorbed nitrogen concentrations above ~0.01 ML, the relatively slow rates of defect generation (undersaturation) and loss (for supersaturation see description and experimental results presented in Example 1) suggest that exchange of defects with the surface involves a significant activation barrier. This barrier results from the full saturation of dangling bonds at terrace sites even in the absence of adsorption. Terraces on the atomically clean Si(100) surface reconstruct to form dimer rows, in which occupied dangling bonds are eliminated through sigma and pi bonding of the dimer atoms to each other. Thus, generation of a defect (e.g., an interstitial) from terrace sites requires disruption of the full complement of four nominal atomic bonds per surface atom. Correspondingly, interstitial loss requires atom insertion into existing bonds rather than addition to a dangling bond. Both processes impose significant activation barriers.

The rapid variation in behavior at adsorbed nitrogen coverages below 0.01 ML (see FIGS. 12, 13 and 17) suggests that the atomically clean surface supports a small concentration of sites that are extraordinarily active for defect exchange, but that passivate (i.e. rendered inactive with respect to defect release into the bulk) when bonded to nitrogen. These sites are quite reactive toward the gas phase; the exposure of $NH_3$ needed to saturate them is roughly $1.5 \times 10^{-5}$ Pa for 0.5 min, or only about 4 L. The correspondence in behavior between implanted material (see experimental results and description in Example 1) and unimplanted material indicates that the most active surface sites comprise some feature intrinsic to the Si(100) surface. Step sites are a likely candidate. For crystallographic orientations less than about 1° from the Si(100) direction, steps fall into only two distinct categories that alternate spatially. So-called "$S_A$" steps have their dimerization direction in the upper terrace perpendicular to the step edge, while for "$S_B$" steps this direction is parallel to the step edge. Atoms at $S_A$ steps do not have dangling bonds, but rebonding at $S_B$ steps leaves some dangling bonds behind. The concentration of $S_B$ atoms for our surface is ~1% of the surface sites, which corresponds to the concentration of adsorbed nitrogen required to passivate the active sites.

As indicated earlier, the strong bonding within solids such as silicon magnifies the importance of the surface in enabling the bulk to reach an equilibrium concentration of defects. If defect exchange with the surface is slow, long periods may be required for the bulk to reach equilibrium.

The present experimental results use $NH_3$ as a surface modification agent which generates surface adsorbed nitrogen capable of eliminating or inactivating dangling bonds on the semiconductor surface. As will be readily understood by those of skill in the art, $NH_3$ is merely an example of one surface modification group useable in the present invention, and the present methods can be practiced using a wide range of surface modification agents. Furthermore, the present invention includes use of surface modification agents that generate a wide range of materials on the semiconductor surface other than surface adsorbed nitrogen, such as chemiadsorbed or physiadsorbed oxygen-containing materials or carbon-containing materials.

4. Conclusions

The implications of this work for defect control and parameter measurement are especially pertinent to strongly bonded solids such as semiconductors, where defect formation rates in the bulk are low so that surfaces play a critical important role. The surface effect extend down at least 0.5 µm, and may go much further in situations where there are no mechanisms for defect exchange with the lattice or with defect clusters. In less strongly bonded solids such as metals where bulk defect formation is faster, these surface effects will be less pronounced and restricted closer to the surface.

The present methods of controlling bulk defects in semiconductor materials offer entirely new possibilities for controlling and manipulating bulk defects in a wide variety of applications. In surface reactions, for example, bulk defect creation, destruction, and diffusion near surfaces plays an important role in adsorption and some forms of thermal catalysis by metal oxides. Bulk defect concentrations also affect photocatalysis rates, since the defects serve as unwanted electron-hole recombination centers. In sensor applications, bulk defect diffusion governs the behavior of solid-state electrolytes such as $ZrO_2$.

The present invention also has applications in other domains beyond gas-solid interactions. Bulk defects often serve as the primary mediators of solid-state diffusion. The rates of defect creation and loss at surfaces can become controlling factors of solid-state diffusion rates—especially when surface-to-volume ratios are high (as in small particles) or when bulk defect formation rates are slow (as in semiconductors). Such defect engineering also is helpful for energy production by semiconductors using solar power (e.g., water splitting), where electron-hole recombination rates in the fabricated devices are affected by the concentrations of bulk defects left over from device fabrication. In yet another application, the reaction of defects with surfaces strongly affects doping processes for integrated circuits by thermal and implantation methods.

We claim:
1. A method for making a doped semiconductor, said method comprising:
   providing a semiconductor having an exposed surface;
   selecting a desired surface abundance of diffusion control groups on said exposed surface from the range of about $5 \times 10^{13}$ molecules cm$^{-2}$ to about $2 \times 10^{15}$ molecules cm$^{-2}$ or from the range of about 0.1 monolayer to about 3 monolayers, wherein said surface abundance of said diffusion control groups is selected so as to control rates of diffusion of dopants to achieve a selected dopant profile;
   treating said exposed surface of said semiconductor with a surface modifying agent, wherein interaction between said surface modifying agent and said semiconductor forms said diffusion control groups on the exposed surface;
   terminating said treating said exposed surface of said semiconductor with said surface modifying agent when said desired surface abundance of diffusion control groups on said exposed surface is reached;
   implanting the semiconductor with a dopant, thereby generating a semiconductor having implanted dopant; and
   annealing the semiconductor having implanted dopant and said desired surface abundance of diffusion control groups, thereby generating said doped semiconductor;
   and wherein said step of implanting the semiconductor with dopants is performed prior to said step of treating the exposed surface of the semiconductor with the surface modifying agent; and wherein said step of treating the exposed surface of said semiconductor with the surface modifying agent is performed prior to said step of annealing said semiconductor having implanted dopant.

2. The method of claim 1 wherein the surface abundance of said diffusion control groups is selected to control the rate of diffusion of dopant during annealing.

3. The method of claim 2 wherein the surface abundance of said diffusion control groups establishes the loss rate of bulk interstitial semiconductor atoms to the exposed surface.

4. The method of claim 3 wherein the surface abundance of said diffusion control groups establishes a surface loss probability for said bulk interstitial semiconductor atoms selected from the range of about $1.0 \times 10^{-5}$ to about 1.

5. The method of claim 3 wherein the surface abundance of said diffusion control groups establishes a surface loss probability for said bulk interstitial semiconductor atoms selected from the range of about $1.0 \times 10^{-4}$ to about $1.0 \times 10^{-2}$.

6. The method of claim 5 wherein said surface loss probability for bulk interstitial semiconductor atoms may be selectively varied over the range of about $1.0 \times 10^{-4}$ to about $1.0 \times 10^{-2}$ by selection of the surface abundance of said diffusion control groups on the exposed surface.

7. The method of claim 3 wherein said exposed surface has a plurality of dangling bonds and formation of said diffusion control groups by interaction of said surface modifying agent and said exposed surface eliminates at least a portion of said dangling bonds on said exposed surface.

8. The method of claim 7 wherein formation of said diffusion control groups by interaction of said surface modifying agent and said exposed surface eliminates between about 20% and about 100% of the dangling bonds on said exposed surface.

9. The method of claim 2 wherein the surface abundance of said diffusion control groups establishes the electric charge of said exposed surface.

10. The method of claim 9 wherein formation of said diffusion control groups by interaction of said surface modifying agent and said exposed surface reduces said electric charge of said exposed surface.

11. The method of claim 9 wherein the surface abundance of said diffusion control groups establishes an electric charge that corresponds to an average electric field of the space charge region proximate to said surface equal to or less than $1 \times 10^{-5}$ V/cm.

12. The method of claim 1 wherein the surface abundance of said diffusion control groups is selected to establish the electric charge of said exposed surface and the loss rate of interstitial semiconductor atoms to the exposed surface.

13. The method of claim 1 wherein said surface modifying agent is a nitrogen-containing gas.

14. The method of claim 13 wherein said nitrogen-containing gas is selected from the group consisting of:
$NH_3$;
$N_2H_4$;
$HN_3$;
NO;
$N_2O$;
$NO_2$;
$N_2O_5$;
$CH_3N_2CH_3$;
$(CH_3)_2NNH_2$;
an amine;
HCN; and
a nitrile.

15. The method of claim 1 wherein said treating the exposed surface of a semiconductor with the surface modifying agent step comprises exposing the exposed surface to a partial pressure of hydrazine or ammonia selected from the range of about $1 \times 10^{-7}$ Torr to about $1 \times 10^{-5}$ Torr.

16. The method of claim 1 wherein said surface modifying agent is a nitrogen plasma or oxygen plasma.

17. The method of claim 1 wherein said surface modifying agent is an oxygen-containing gas.

18. The method of claim 17 wherein said oxygen-containing gas is selected from the group consisting of:
$O_2$;
$H_2O$;
$H_2O_2$; and
$O_3$.

19. The method of claim 1 wherein said surface modifying agent is carbon-containing gas.

20. The method of claim 19 wherein said carbon-containing gas is selected from the group consisting of:
CO;
an alcohol;
an organic acid;
an aldehyde; and
an ester.

21. The method of claim 19 wherein said carbon-containing gas is a hydrocarbon.

22. The method of claim 1 wherein said diffusion control groups comprise material physiadsorbed to said exposed surface, material chemiadsorbed to said exposed surface or both.

23. The method of claim 1 wherein said diffusion control groups comprises a nitride group.

24. The method of claim 1 wherein said semiconductor comprises silicon and wherein said diffusion control groups comprise groups having at least one Si—N bond or groups having at least one Si=N double bond.

25. The method of claim 1 wherein said exposed surface is an atomically clean surface having a plurality of dangling bonds.

26. The method of claim 1 further comprising a step of treating the exposed surface of the semiconductor with a second surface modifying agent prior to the step of implanting the semiconductor with dopants.

27. The method of claim 1 wherein said step of treating said exposed surface of said semiconductor with a surface modifying agent is carried out a temperature selected from about 400° C. to about 900° C.

28. A method for controlling dopant diffusion during annealing, said method comprising the steps of:
providing a semiconductor having an exposed surface;
selecting a desired surface abundance of diffusion control groups on said exposed surface from the range of about $5 \times 10^{13}$ molecules cm$^{-2}$ to about $2 \times 10^{15}$ molecules cm$^{-2}$ or from the range of about 0.1 monolayer to about 3 monolayers, wherein said surface abundance of said diffusion control groups is selected so as to control the loss rate of bulk interstitial semiconductor atoms to the exposed surface to achieve a desired rate of diffusion of dopants during annealing;
treating said exposed surface of said semiconductor with a surface modifying agent, wherein interaction between said surface modifying agent and said semiconductor forms said diffusion control groups on the exposed surface;
terminating said treating said exposed surface of said semiconductor with said surface modifying agent when said desired surface abundance of diffusion control groups on said exposed surface is reached;
implanting the semiconductor with a dopant thereby generating a semiconductor having implanted dopant; and annealing the semiconductor having implanted dopant and said desired surface abundance of diffusion control groups, thereby controlling the rate of diffusion of the dopants during annealing;

and wherein said step of implanting the semiconductor with dopants is performed prior to said step of treating the exposed surface of the semiconductor with the surface modifying agent; and wherein said step of treating the exposed surface of said semiconductor with the surface modifying agent is performed prior to said step of annealing said semiconductor having implanted dopant.

* * * * *